US012812271B2

(12) United States Patent
Sasago et al.

(10) Patent No.: US 12,812,271 B2
(45) Date of Patent: Nov. 24, 2026

(54) PHOTOELECTRIC CONVERSION APPARATUS, PHOTOELECTRIC CONVERSION SYSTEM, MOVING BODY, AND EQUIPMENT

(71) Applicant: CANON KABUSHIKI KAISHA, Tokyo (JP)

(72) Inventors: Tomoya Sasago, Kanagawa (JP); Kazuhiro Morimoto, Kanagawa (JP); Yu Maehashi, Hokkaido (JP)

(73) Assignee: Canon Kabushiki Kaisha, Tokyo (JP)

( * ) Notice: Subject to any disclaimer, the term of this patent is extended or adjusted under 35 U.S.C. 154(b) by 138 days.

(21) Appl. No.: 18/814,829

(22) Filed: Aug. 26, 2024

(65) Prior Publication Data

US 2025/0080881 A1 Mar. 6, 2025

(30) Foreign Application Priority Data

Aug. 30, 2023 (JP) ................................ 2023-140273

(51) Int. Cl.

| | |
|---|---|
| ***H04N 25/79*** | (2023.01) |
| ***H04N 25/773*** | (2023.01) |
| ***H10F 30/225*** | (2025.01) |
| ***H10F 39/00*** | (2025.01) |
| ***H10F 77/00*** | (2025.01) |

(52) U.S. Cl.
CPC ........... *H04N 25/79* (2023.01); *H04N 25/773* (2023.01); *H10F 30/225* (2025.01); *H10F 39/811* (2025.01); *H10F 77/959* (2025.01)

(58) Field of Classification Search
CPC .... H04N 25/773; H04N 25/79; H10F 30/225; H10F 39/811; H10F 77/959
See application file for complete search history.

(56) References Cited

U.S. PATENT DOCUMENTS

| | | | |
|---|---|---|---|
| 8,598,901 | B2 | 12/2013 | Hiyama |
| 8,711,259 | B2 | 4/2014 | Maehashi |
| 9,407,847 | B2 | 8/2016 | Maehashi |
| 9,762,840 | B2 | 9/2017 | Yamazaki |

(Continued)

FOREIGN PATENT DOCUMENTS

| | | |
|---|---|---|
| JP | 2002-084235 A | 3/2002 |

OTHER PUBLICATIONS

U.S. Appl. No. 18/675,563, filed May 28, 2024 (First Named Inventor: Toshiki Tsuboi).

(Continued)

*Primary Examiner* — Lin Ye
*Assistant Examiner* — Chriss S Yoder, III
(74) *Attorney, Agent, or Firm* — Venable LLP

(57) ABSTRACT

A photoelectric conversion apparatus is provided. The apparatus includes a first substrate including an avalanche photodiode, a second substrate, a third substrate, and a temperature detection element having an output characteristic dependent on temperature. A signal processing circuit configured to process a signal output from the avalanche photodiode is arranged in at least parts of the second substrate and the third substrate, the first substrate, the second substrate, and the third substrate are stacked such that the second substrate is arranged between the first substrate and the third substrate, and the temperature detection element is arranged in one of the first substrate and the second substrate.

19 Claims, 22 Drawing Sheets

(56) References Cited

U.S. PATENT DOCUMENTS

| | | | | |
|---|---|---|---|---|
| 9,986,194 | B2 | 5/2018 | Maehashi | |
| 10,419,695 | B2 | 9/2019 | Sasago | |
| 10,971,539 | B2 | 4/2021 | Maehashi | |
| 11,057,551 | B2 | 7/2021 | Nishide | |
| 11,240,453 | B2 | 2/2022 | Maehashi | |
| 11,706,518 | B2 | 7/2023 | Nishide | |
| 11,818,483 | B2 | 11/2023 | Sasago | |
| 11,943,527 | B2 | 3/2024 | Nishide | |
| 12,119,334 | B2 | 10/2024 | Ota | |
| 2019/0371850 | A1 | 12/2019 | Tashiro | |
| 2022/0115366 | A1* | 4/2022 | Ota | G01K 7/01 |
| 2022/0182523 | A1* | 6/2022 | Ito | G01S 7/4816 |
| 2023/0115792 | A1 | 4/2023 | Maehashi | |
| 2023/0215884 | A1 | 7/2023 | Sekine | |
| 2023/0215893 | A1 | 7/2023 | Sekine | |
| 2023/0215898 | A1 | 7/2023 | Sekine | |
| 2023/0215899 | A1 | 7/2023 | Sekine | |
| 2024/0012150 | A1* | 1/2024 | Tsukuda | G01S 17/894 |
| 2024/0088186 | A1 | 3/2024 | Shirahige | |
| 2024/0196080 | A1 | 6/2024 | Nishide | |

OTHER PUBLICATIONS

U.S. Appl. No. 18/760,394, filed Jul. 1, 2024 (First Named Inventor: Naoki Isoda).
U.S. Appl. No. 18/768,967, filed Jul. 10, 2024 (First Named Inventor: Yu Maehashi).
U.S. Appl. No. 18/819,120, filed Aug. 29, 2024 (First Named Inventor: Hiroshi Sekine).
U.S. Appl. No. 18/822,626, filed Sep. 3, 2024 (First Named Inventor: Hiroshi Sekine).
U.S. Appl. No. 18/882,053, filed Sep. 11, 2024 (First Named Inventor: Hiroshi Sekine).
U.S. Appl. No. 18/886,545, filed Sep. 16, 2024 (First Named Inventor: Yasuharu Ota).
U.S. Appl. No. 18/894,446, filed Sep. 24, 2024 (First Named Inventor: Yasuharu Ota).
U.S. Appl. No. 18/894,465, filed Sep. 24, 2024 (First Named Inventor: Hiroshi Sekine).
U.S. Appl. No. 18/901,443, filed Sep. 30, 2024 (First Named Inventor: Ayman Tarek Abdelghafar).

* cited by examiner

PHOTOELECTRIC CONVERSION APPARATUS, PHOTOELECTRIC CONVERSION SYSTEM, MOVING BODY, AND EQUIPMENT

BACKGROUND OF THE INVENTION

Field of the Invention

The present disclosure relates to a photoelectric conversion apparatus, a photoelectric conversion system, a moving body, and equipment.

Description of the Related Art

An avalanche photodiode (APD) capable of detecting light at the level of individual photons is known. The characteristics of the APD change depending on temperature. Japanese Patent Laid-Open No. 2002-084235 describes a control circuit that includes a temperature sensor and controls, in accordance with the measured temperature, the bias voltage applied to the APD.

To control the characteristics of the APD with high accuracy, it is necessary to detect the temperature with high accuracy.

SUMMARY OF THE INVENTION

Some embodiments of the present disclosure provide a technique advantageous in improving the temperature detection accuracy.

According to some embodiments, a photoelectric conversion apparatus comprising a first substrate including an avalanche photodiode, a second substrate, a third substrate, and a temperature detection element having an output characteristic dependent on temperature, wherein a signal processing circuit configured to process a signal output from the avalanche photodiode is arranged in at least parts of the second substrate and the third substrate, the first substrate, the second substrate, and the third substrate are stacked such that the second substrate is arranged between the first substrate and the third substrate, and the temperature detection element is arranged in one of the first substrate and the second substrate, is provided.

According to some other embodiments, a photoelectric conversion apparatus comprising a first substrate including an avalanche photodiode, a second substrate including a signal processing circuit configured to process a signal output from the avalanche photodiode, and a temperature detection element having an output characteristic dependent on temperature, wherein the first substrate and the second substrate are stacked, the temperature detection element is arranged in the first substrate, the first substrate comprises a first semiconductor layer, and a first insulating layer arranged between the first semiconductor layer and the second substrate, the second substrate comprises a second semiconductor layer, and a second insulating layer arranged between the second semiconductor layer and the first insulating layer, the first substrate and the second substrate are bonded via a plurality of bonded portions, in each of the plurality of bonded portions, a metal pattern arranged in a surface of the first insulating layer facing the second substrate is in contact with a metal pattern arranged in a surface of the second insulating layer facing the first substrate, a bonded face between the first substrate and the second substrate includes a first region where, among the plurality of bonded portions, not less than one bonded portion in contact with a metal plug is arranged, and a second region where, among the plurality of bonded portions, not less than one bonded portion in contact with no metal plug is arranged, and in an orthogonal projection to the bonded face, the temperature detection element is arranged at a position overlapping the second region, is provided.

Further features of the present invention will become apparent from the following description of exemplary embodiments (with reference to the attached drawings).

DESCRIPTION OF THE EMBODIMENTS

Figure 1:
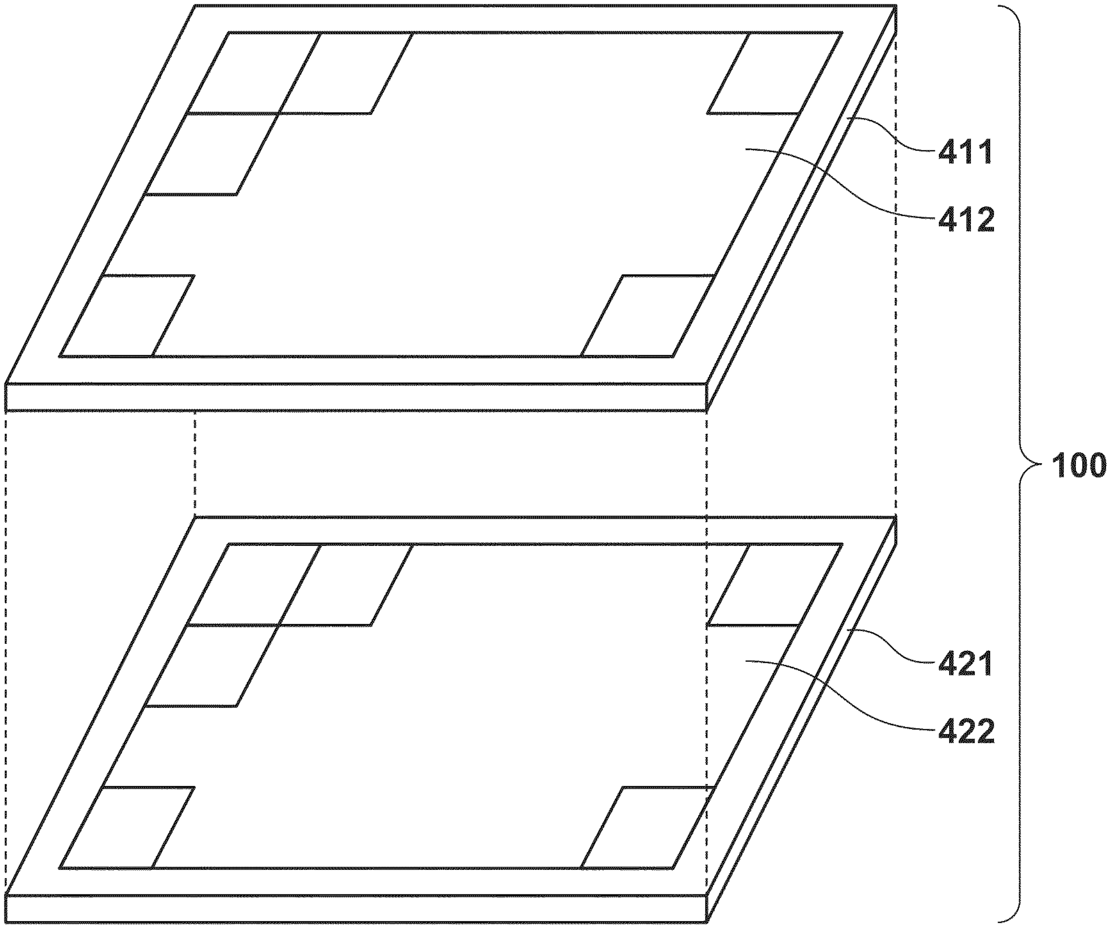
FIG. 1 is a view showing an arrangement example of a photoelectric conversion apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First, the common arrangement in the first embodiment will be described with reference to FIGS. 1 to 5. FIG. 1 is a view showing an arrangement example of a photoelectric conversion apparatus 100. The photoelectric conversion apparatus 100 is formed by stacking two substrates of a sensor substrate 411 and a circuit substrate 421 and electrically connecting them. That is, the photoelectric conversion apparatus 100 is a stacked-type device. In the arrangement shown in FIG. 1, a circuit for processing a signal output from the sensor substrate is formed in one circuit substrate 421. However, the present invention is not limited to this. As will be described below, the circuit substrate 421 may be formed by stacking two or more substrates, and the circuit for processing a signal output from the sensor substrate may be formed across the stacked substrates.

In the sensor substrate 411, a plurality of pixels 250 are arranged. In the circuit substrate 421, circuits such as signal processing circuits 253 for processing signals output from the pixels 250 are arranged. The photoelectric conversion apparatus 100 can be a so-called backside illumination photoelectric conversion apparatus in which light enters the sensor substrate 411 from the opposite side of an insulating layer where wiring patterns are arranged.

The sensor substrate 411 and the circuit substrate 421 will be described below as diced chips, but they are not limited to chips. For example, each of the sensor substrate 411 and the circuit substrate 421 may be formed by stacking wafers. Alternatively, each of the sensor substrate 411 and the circuit substrate 421 may be obtained by stacking wafers and dicing them, or may be obtained by dividing wafers into chips (into pieces) and stacking and bonding the chips.

In the sensor substrate 411, a pixel region 412 including the plurality of pixels 250 is arranged. In the circuit substrate 421, a circuit region 422 is arranged, in which signals detected in the pixel region 412 are processed.

Figure 2:
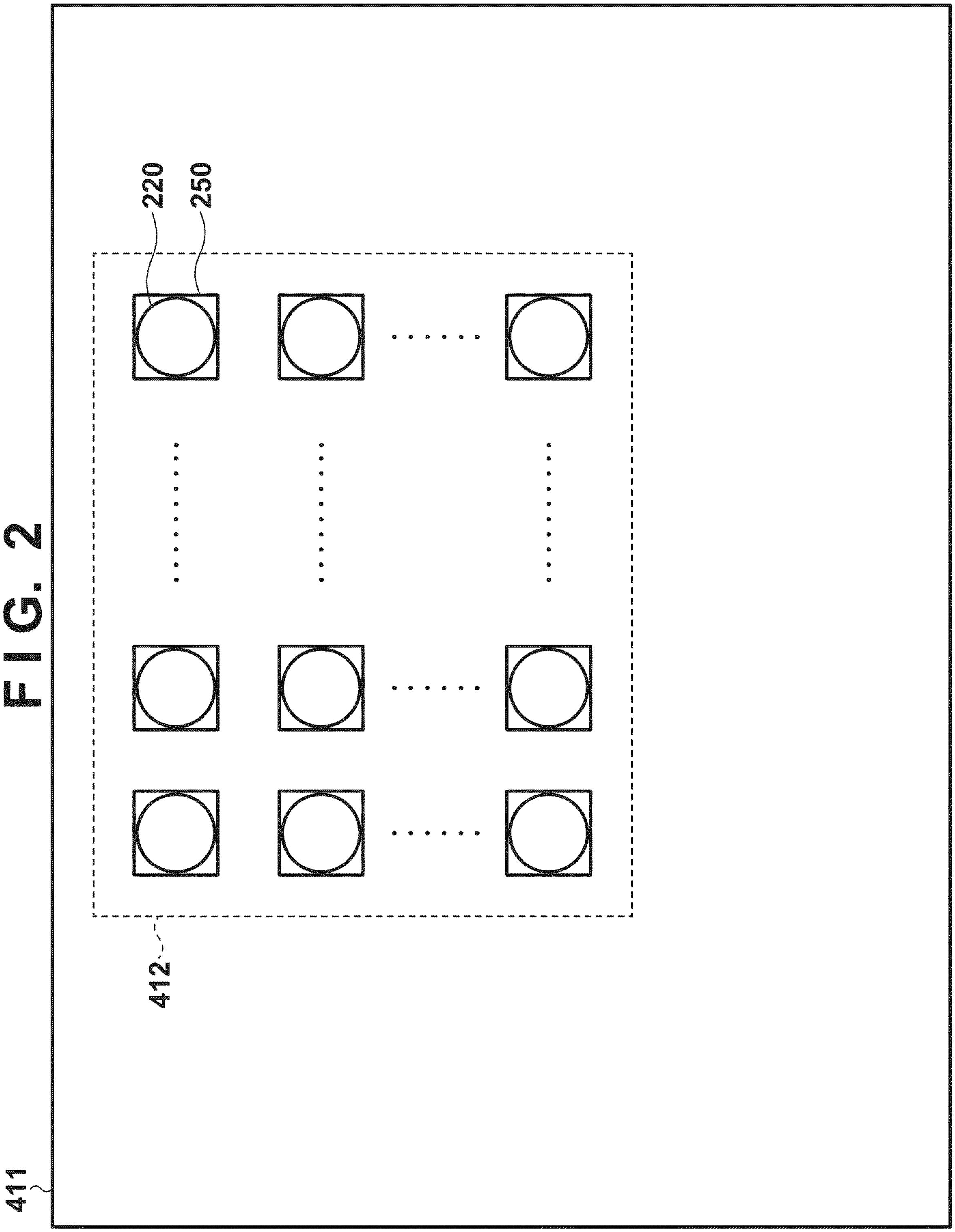
FIG. 2 is a view showing an arrangement example of the sensor substrate of the photoelectric conversion apparatus shown in FIG. 1.

FIG. 2 is a view showing an arrangement example of the sensor substrate 411. The pixels 250 each including a photoelectric conversion element 220 such as an avalanche photodiode (APD) are arranged in a two-dimensional array in a planar view, thereby forming the pixel region 412. The planar view refers to, for example, viewing a plane in a direction parallel to the stacking direction of the sensor substrate 411 and the circuit substrate 421. Typically, the pixel 250 is a pixel for generating an image. However, if the photoelectric conversion apparatus 100 is used for a Time of Flight (ToF) sensor or the like, the pixel 250 need not always be used for generating an image. That is, the pixel 250 may be configured to be used for measuring the light arrival time and the amount of light.

Figure 3:
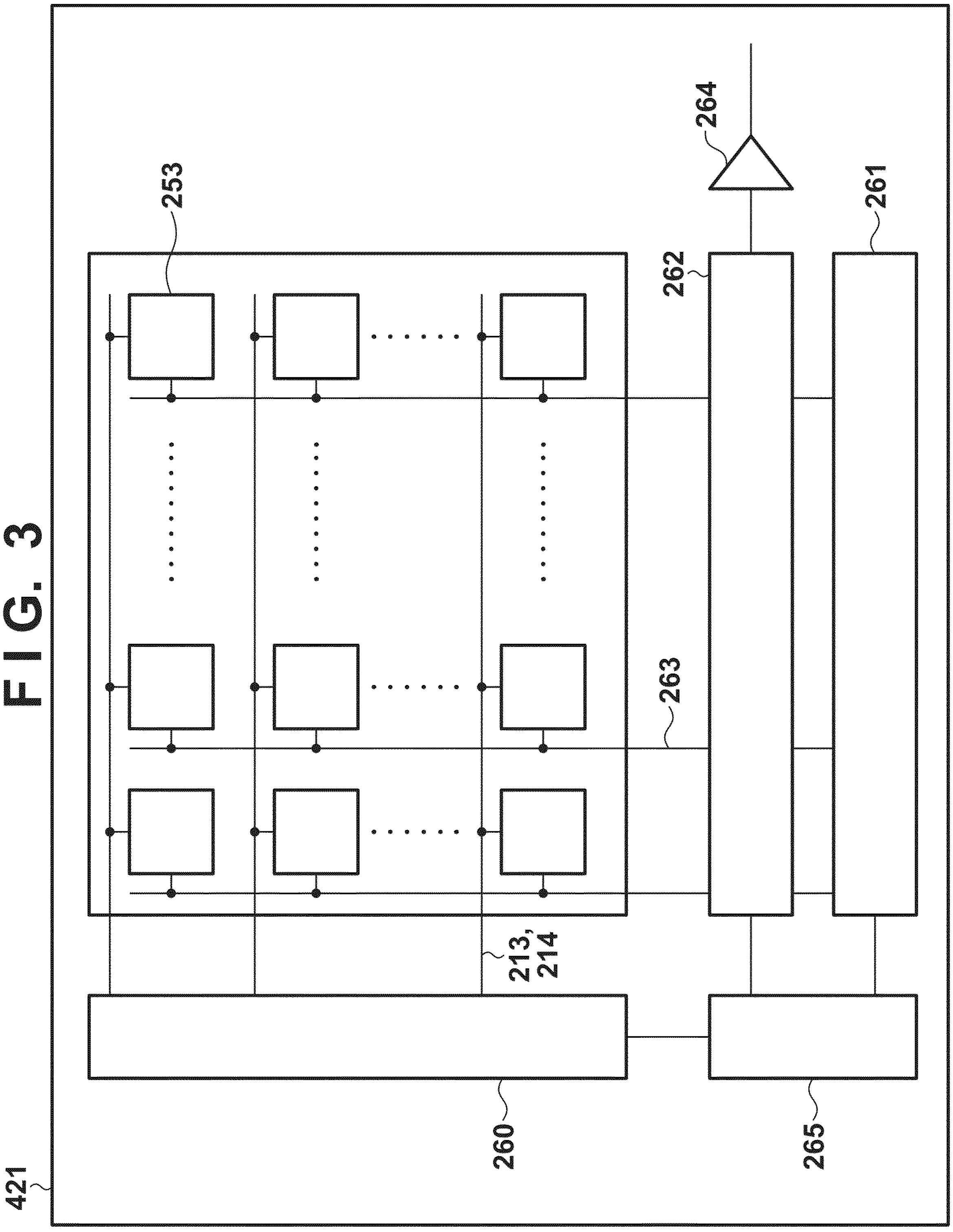
FIG. 3 is a block diagram showing an arrangement example of the circuit substrate shown in FIG. 1.

FIG. 3 is a view showing an arrangement example of the circuit substrate 421. The circuit substrate 421 includes the signal processing circuit 253 for processing electric charges photoelectrically converted by the photoelectric conversion element 220 shown in FIG. 2, a readout circuit 262, a control pulse generation circuit 265, a horizontal scanning circuit 261, signal lines 263, a vertical scanning circuit 260, and the like. The signal processing circuit 253 shown in FIG. 3 may be arranged so as to correspond to each pixel 250 shown in FIG. 2. In this case, the pixel 250 (photoelectric conversion element 220) and the signal processing circuit 253 may be electrically connected via a connection wiring provided for each pixel 250.

The vertical scanning circuit 260 receives a control pulse supplied from the control pulse generation circuit 265, and supplies a control pulse to each pixel 250. Logic circuits such as a shift register and an address decoder can be used for the vertical scanning circuit 260.

A signal output from the pixel 250 is processed by the signal processing circuit 253. The signal processing circuit 253 can be provided with a counter, a memory, and the like. The memory can hold, as a digital value, a count value obtained by counting by the counter.

To read out the signal from the memory of the signal processing circuit 253 corresponding to each pixel 250 and holding the digital signal, the horizontal scanning circuit 261 inputs, to the signal processing circuit 253, a control pulse for sequentially selecting respective columns. For the selected column, the signal is output to the signal line 263 from the signal processing circuit 253 corresponding to the pixel 250 and selected by the vertical scanning circuit 260. The signal output to the signal line 263 is output via an output circuit 264 to a recording unit or a signal processing unit outside the photoelectric conversion apparatus 100.

The array of the pixels 250 in the pixel region 412 shown in FIG. 2 is not limited to a two-dimensional array. The pixels 250 may be arranged one-dimensionally. The function of the signal processing circuit 253 need not always be provided one by one in all the pixels 250 (photoelectric conversion elements 220). For example, one signal processing circuit 253 may be shared between the plurality of pixels 250 (photoelectric conversion elements 220) to sequentially perform signal processing.

As shown in FIGS. 2 and 3, a plurality of the signal processing circuits 253 can be arranged in a region overlapping the pixel region 412 in the orthogonal projection to the pixel region 412. The vertical scanning circuit 260, the horizontal scanning circuit 261, the readout circuit 262, the output circuit 264, the control pulse generation circuit 265, and the like can be so arranged as to overlap a gap between the end of the sensor substrate 411 and the end of the pixel region 412. In other words, the sensor substrate 411 has the pixel region 412 and a non-pixel region arranged around the pixel region 412. In this case, the vertical scanning circuit 260, the horizontal scanning circuit 261, the readout circuit 262, the output circuit 264, and the control pulse generation circuit 265 can be arranged in a region overlapping the non-pixel region.

Figure 4:
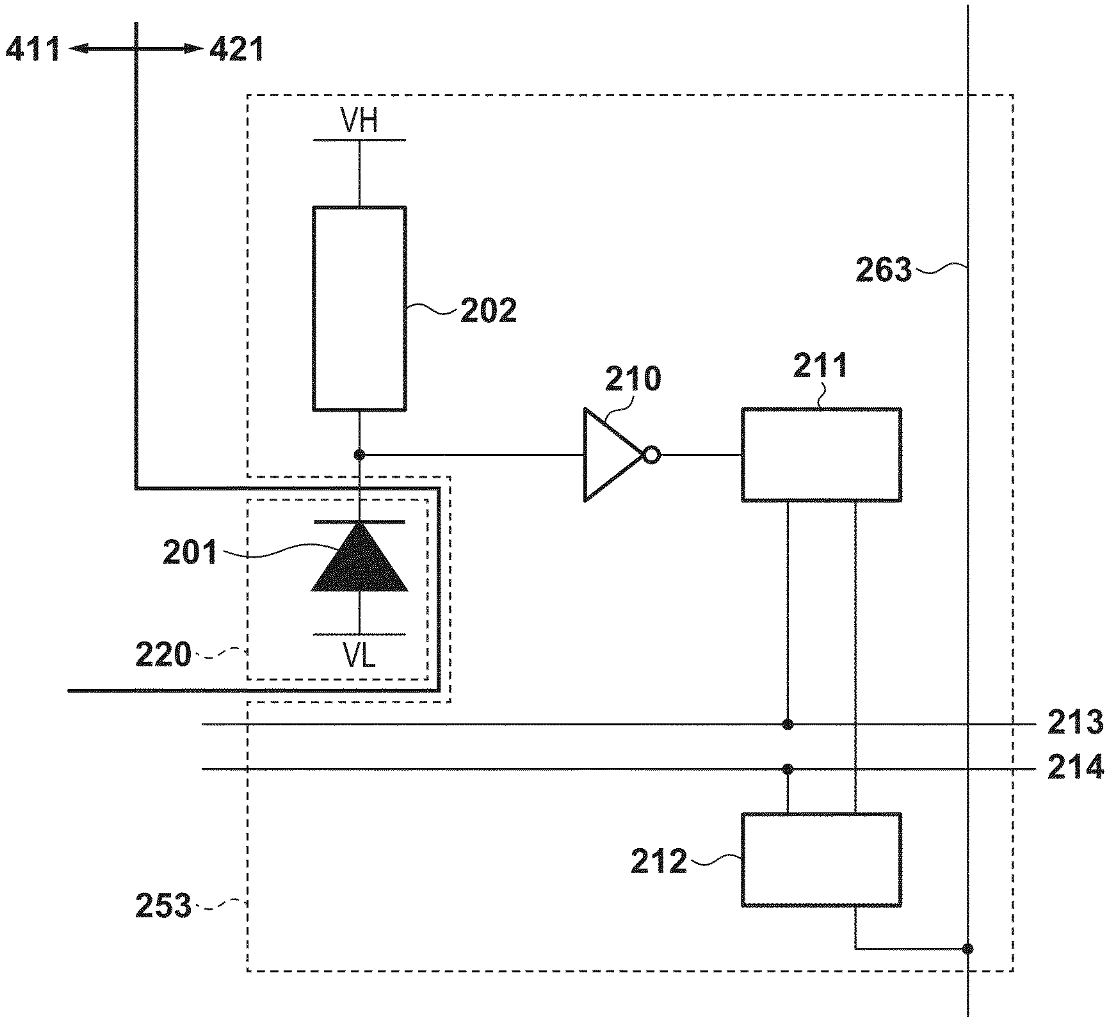
FIG. 4 is a circuit diagram showing an arrangement example of the pixel of the photoelectric conversion apparatus shown in FIG. 1.

FIG. 4 shows an example of a block diagram including an equivalent circuit when paying attention to one pixel 250 (photoelectric conversion element 220). In FIG. 4, the photoelectric conversion element 220 including an APD 201 is provided in the sensor substrate 411, and the remaining components are provided in the circuit substrate 421.

The APD 201 generates a charge pair corresponding to incident light by photoelectric conversion. A potential VL is supplied to the anode of the APD 201. A potential VH higher than the potential VL supplied to the anode is supplied to the cathode of the APD 201. A reverse bias voltage is supplied to the anode and the cathode so that the APD 201 performs an avalanche multiplication operation. In a state in which such a reverse bias voltage is supplied, charges generated by incident light cause avalanche multiplication, generating an avalanche current.

In a case where the reverse bias voltage is supplied to the APD 201, there are a Geiger mode in which the APD 201 is operated by a potential difference (voltage) between the anode and the cathode larger than a breakdown voltage, and a linear mode in which the APD 201 is operated by a potential difference between the anode and the cathode around the breakdown voltage or equal to or lower than the breakdown voltage. An APD operated in the Geiger mode is called a Single Photon Avalanche Diode (SPAD). For example, the potential VL is −30 V, and the potential VH is 1 V. The APD 201 may be operated in the linear mode or the Geiger mode.

A quench element 202 is connected between a power supply that supplies the potential VH, and the APD 201. The quench element 202 functions as a load circuit (quench circuit) at the time of signal multiplication by avalanche multiplication, and operates to suppress a voltage supplied to the APD 201 and suppress avalanche multiplication (quench operation). The quench element 202 also operates to return the voltage supplied to the APD 201 to a voltage (VH-VL) by supplying a current by an amount corresponding to a voltage drop caused by the quench operation (recharge operation). The quench element 202 can be formed by, for example, a MOS transistor.

The signal processing circuit 253 can include a waveform shaping circuit 210, a counter circuit 211, and a selection circuit 212. In this specification, the signal processing circuit 253 suffices to include any of the waveform shaping circuit 210, the counter circuit 211, and the selection circuit 212.

The waveform shaping circuit 210 shapes a potential change of the cathode of the APD 201 that is obtained at the time of photon detection, and outputs a pulse signal. As the waveform shaping circuit 210, for example, an inverter circuit is used. In the arrangement shown in FIG. 4, the use of one inverter as the waveform shaping circuit 210 is exemplified. However, the present invention is not limited to this, and a circuit constituted by series-connecting a plurality of inverters may be used as the waveform shaping circuit 210 or another circuit having the waveform shaping effect may be used.

The counter circuit 211 counts pulse signals output from the waveform shaping circuit 210 and holds the count value. When a control pulse pRES is supplied from the vertical scanning circuit 260 via a driving line 213, the signal held by the counter circuit 211 is reset.

The selection circuit 212 receives a control pulse pSEL from the vertical scanning circuit 260 shown in FIG. 3 via a driving line 214 shown in FIG. 4, and switches electrical connection/disconnection between the counter circuit 211 and the signal line 263. The selection circuit 212 includes, for example, a buffer circuit for outputting a signal.

A switching element such as a transistor may be interposed between the quench element 202 and the APD 201 or between the photoelectric conversion element 220 and the signal processing circuit 253 so that electrical connection can be switched. Similarly, supply of the potential VH or potential VL to the photoelectric conversion element 220 may be electrically switchable using a switching element such as a transistor.

In this embodiment, the counter circuit 211 is arranged in the signal processing circuit 253. However, the present invention is not limited to this, and a Time-to-Digital Converter (TDC) and a memory may be used instead of the counter circuit 211 so that the photoelectric conversion apparatus 100 obtains a pulse detection timing. In this case, the generation timing of a pulse signal output from the waveform shaping circuit 210 is converted into a digital signal by the TDC. The TDC receives a control pulse pREF (reference signal) from the vertical scanning circuit 260 via a driving line for measurement of the timing of the pulse signal. By using the control pulse pREF as a reference, the TDC obtains, as a digital signal, a signal when the input timing of a signal output from each pixel 250 via the waveform shaping circuit 210 is regarded as a relative time.

In the arrangement example shown in FIG. 4, the quench element 202, the waveform shaping circuit 210, the counter circuit 211, and the selection circuit 212 are arranged in one circuit substrate 421. However, the present invention is not limited to this. For example, the quench element 202 and the waveform shaping circuit 210 may be arranged in one substrate, the counter circuit 211 and the selection circuit 212 may be arranged in another substrate, and these substrates may be stacked.

Figure 5A:
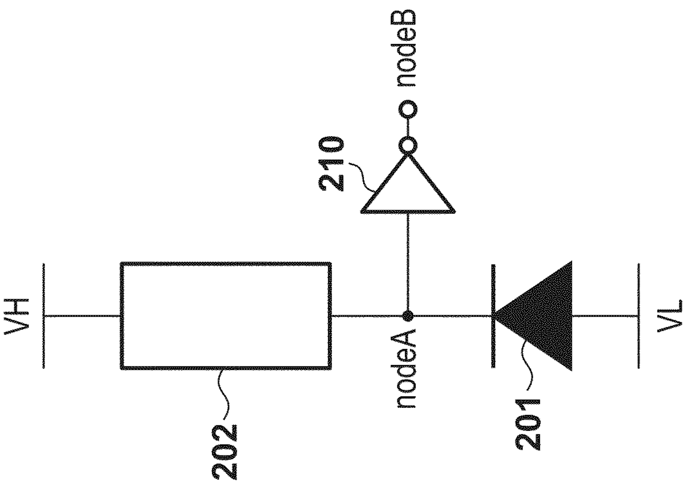
FIGS. 5A and 5B are views for explaining an operation example of the pixel shown in FIG. 4.
Figure 5B:
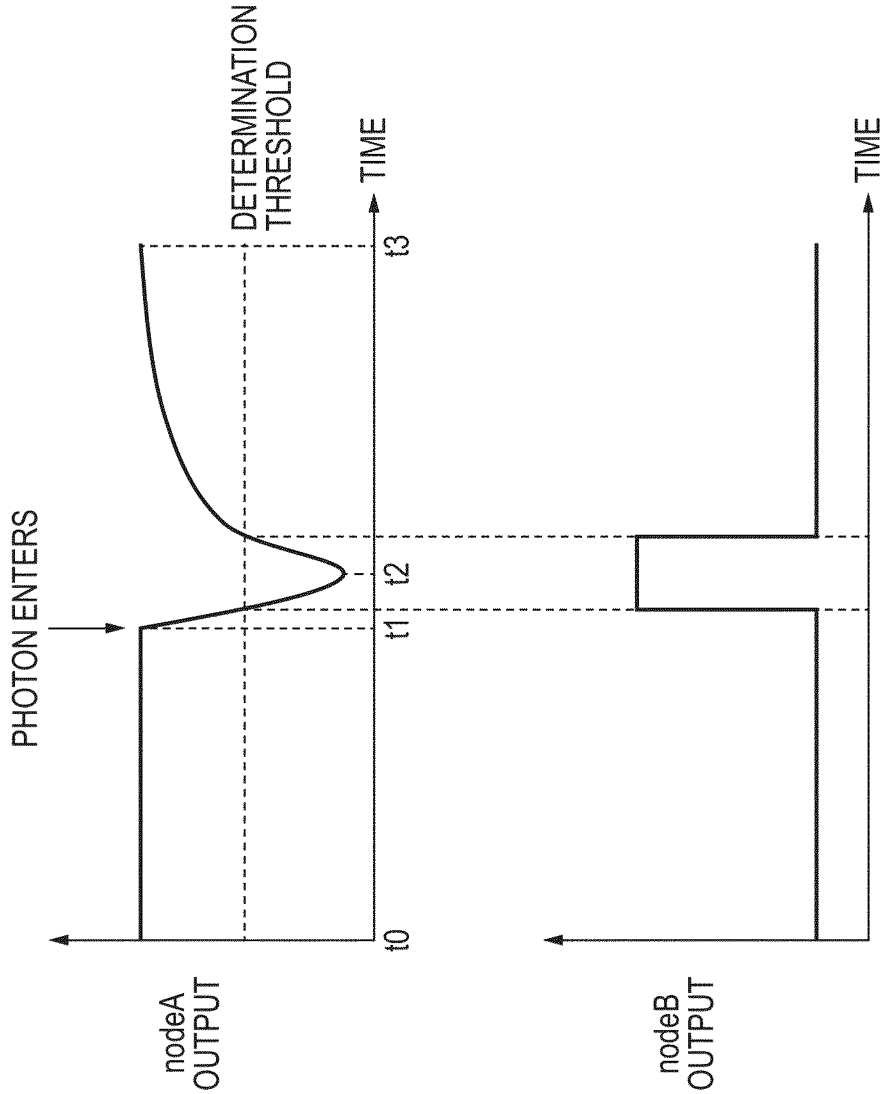

FIGS. 5A and 5B are a view and a graph, respectively, schematically showing the relationship between the operation of the APD 201 and an output signal. FIG. 5A is a view showing an excerpt of the APD 201, quench element 202, and waveform shaping circuit 210 shown in FIG. 4. Here, the input side of the waveform shaping circuit 210 is a node A and its output side is a node B. FIG. 5B shows waveform changes at the node A and the node B.

From time t0 to time t1, a potential difference (voltage) of the potential VH—the potential VL is applied to the APD 201. When a photon enters the APD 201 at time t1, avalanche multiplication occurs in the APD 201, an avalanche multiplication current flows into the quench element 202, and the potential of the node A drops. When the voltage drop amount further increases and the potential difference applied to the APD 201 decreases, the avalanche multiplication of the APD 201 stops as shown at time t2, and the potential level of the node A does not drop any more from a predetermined value. In a period between time t2 and time t3, a current compensating for the voltage drop from the potential VL flows to the node A. At time t3, the node A is statically determined at the original potential level. A portion at which the output waveform exceeds a given threshold at the node A is waveform-shaped by the waveform shaping circuit 210 and output as a signal to the node B.

The arrangement of the signal lines 263, readout circuit 262, and output circuit 264 is not limited to the arrangement shown in FIG. 3. For example, each signal line 263 may be arranged to extend in the row direction (the longitudinal direction in FIG. 3), and the readout circuit 262 may be arranged at the end of the signal line 263.

Figure 6A:
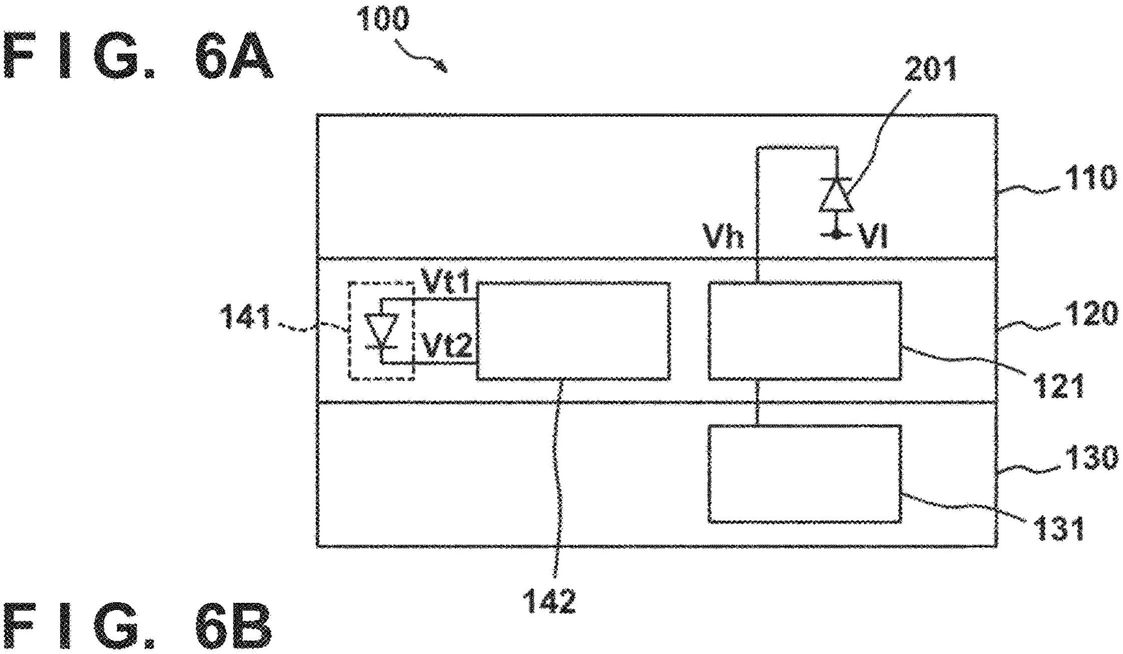
FIGS. 6A to 6D are views showing an arrangement example of a temperature detection element of the photoelectric conversion apparatus shown in FIG. 1.
Figure 6B:
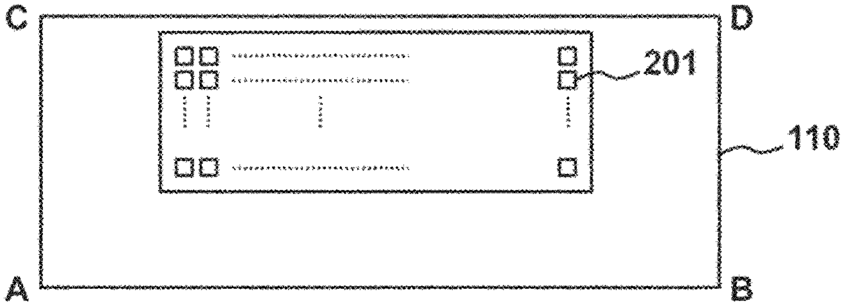
Figure 6C:
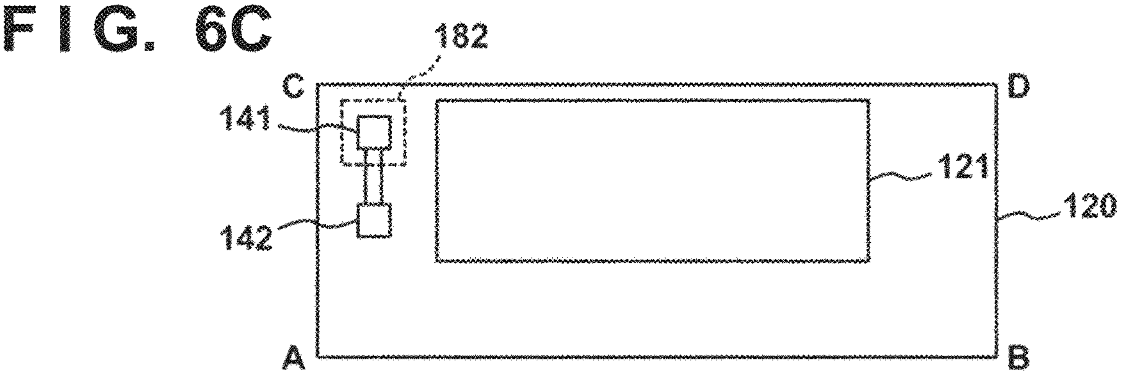
Figure 6D:
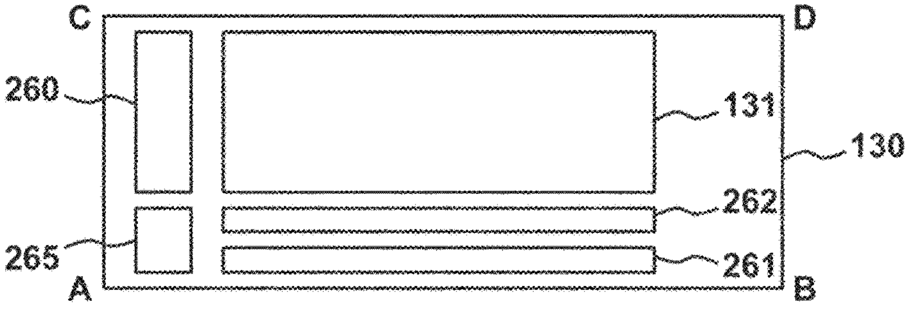

Next, the arrangement of a temperature detection element for detecting the temperature of the pixel 250 in the photoelectric conversion apparatus 100 having a stacked structure will be described in detail. FIGS. 6A to 6D are views showing an arrangement example of a temperature detection element 141 of the photoelectric conversion apparatus 100. FIG. 6A shows the photoelectric conversion apparatus 100 where three substrates 110, 120, and 130 are stacked. FIGS. 6B, 6C, and 6D show arrangement examples of the main circuits in the substrates 110, 120, and 130, respectively.

The photoelectric conversion apparatus 100 includes the substrate 110 including the APD 201, the substrates 120 and

130 including signal processing circuits 121 and 131 configured to process a signal output from the APD 201, respectively, and a temperature detection element 141 having an output characteristic dependent on temperature. The substrate 110, the substrate 120, and the substrate 130 are stacked such that the substrate 120 is arranged between the substrate 110 and the substrate 130. The substrate 110 can be configured to have an arrangement similar to that of the sensor substrate 411. The substrates 120 and 130 can be configured such that a part of the arrangement included in the circuit substrate 421 is arranged in the substrate 120, and the remaining part of the arrangement is arranged in the substrate 130. The photoelectric conversion apparatus 100 includes the above-described vertical scanning circuit 260, horizontal scanning circuit 261, readout circuit 262, and control pulse generation circuit 265 for operating the APD 201. The vertical scanning circuit 260, the horizontal scanning circuit 261, the readout circuit 262, and the control pulse generation circuit 265 are arranged in, for example, the substrate 130.

The characteristic of the APD 201 such as the breakdown voltage which causes avalanche multiplication changes depending on temperature. Therefore, control such as adjustment of the bias voltage is performed in accordance with a temperature change. To control the characteristics of the APD 201 with high accuracy, it is necessary to detect the temperature with high accuracy. Therefore, the temperature around the APD 201 should be easily transferred to the temperature detection element 141, but the heat generated by the vertical scanning circuit 260, the horizontal scanning circuit 261, readout circuit 262, the control pulse generation circuit 265, or the like should not be easily transferred to the temperature detection element 141. Hence, the temperature detection element 141 is arranged in the substrate 110 where the APD 201 is arranged, or the substrate 120 close to the substrate 110 where the APD 201 is arranged.

FIGS. 6A to 6D show an example in which the temperature detection element 141 is arranged in the substrate 120. When the temperature detection element 141 is arranged not in the substrate 110 but in the substrate 120, a manufacturing process optimized for the characteristics of the APD 201 can be employed to form the APD 201 in the substrate 110. As a result, the characteristics of the APD 201 can be improved. For example, as shown in FIG. 6A, when using a diode as the temperature detection element 141, a diode larger than the APD 201 may be used to accurately measure the temperature. In addition, the impurity concentration profile is different between the APD 201 and the temperature detection element 141. Therefore, respectively forming the APD 201 and the temperature detection element 141 in different substrates 110 and 120 can facilitate improvement of the characteristics of the APD 201.

As shown in FIGS. 6A, 6C, and 6D, the signal processing circuit 121 and the signal processing circuit 131 are respectively formed in different substrates 120 and 130. In this case, the power supply voltage supplied to the circuit may be different between the signal processing circuit 121 arranged in the substrate 120 and the signal processing circuit 131 arranged in the substrate 130. For example, the signal processing circuit 121 arranged in the substrate 120 may include a transistor supplied with a power supply voltage higher than a power supply voltage supplied to the signal processing circuit 131 arranged in the substrate 130. For example, a 2.5-V transistor may be arranged in the signal processing circuit 121, and a 1.1-V transistor may be arranged in the signal processing circuit 131. The transistor arranged in the signal processing circuit 121 can be, for example, a quench element or a waveform shaping circuit. The transistor arranged in the signal processing circuit 131 can be, for example, a counter circuit. By changing the power supply voltage between the signal processing circuit 121 and the signal processing circuit 131, the arrangements suitable for respective circuits arranged in the substrates 120 and 130 can be obtained.

For example, the quench element 202 and the waveform shaping circuit 210 shown in FIG. 4 may be arranged as the signal processing circuit 121 in the substrate 120. Further, for example, the counter circuit 211 and the selection circuit 212 shown in FIG. 4 may be arranged as the signal processing circuit 131 arranged in the substrate 130. Furthermore, the signal processing circuit 131 may include a memory, a buffer, and the like. For example, not only the signal processing circuit 131 arranged in the substrate 130 but also the vertical scanning circuit 260, the horizontal scanning circuit 261, the readout circuit 262, and the control pulse generation circuit 265 may be formed by 1.1-V transistors. For example, as compared to the transistor arranged in each circuit in the substrate 120, the transistor arranged in each circuit in the substrate 130 can be a miniaturized transistor. In this manner, by distributing transistors to the substrate 120 and the substrate 130 according to the power supply voltage, it is possible to employ the manufacturing process suitable for each of the substrate 120 and the substrate 130. However, the present invention is not limited to this, and a transistor (for example, 1.1-V transistor) whose withstand voltage is equal to that of the transistor arranged in the substrate 130 may be arranged in the substrate 120.

In the arrangement shown in FIGS. 6A and 6C, a temperature value generation circuit 142 is arranged in the substrate 120, which generates a signal indicating temperature information from the output of the temperature detection element 141. The temperature value generation circuit 142 generates a signal indicating temperature information by, for example, AD-converting the output of the temperature detection element 141. The temperature value generation circuit 142 needs to generate a signal indicating temperature information with high accuracy from the signal output from the temperature detection element 141. As has been described above, a large transistor whose withstand voltage is higher than that of the transistor arranged in the substrate 130 can be arranged in the substrate 120. Therefore, arranging the temperature value generation circuit 142 in the substrate 120 can decrease the influence of manufacturing variations or the like, and facilitate the design of the temperature value generation circuit 142. Further, as shown in FIGS. 6C and 6D, the substrate 120 can have more space than the substrate 130. Hence, the temperature value generation circuit 142 may be arranged in the substrate 120.

Figure 7:
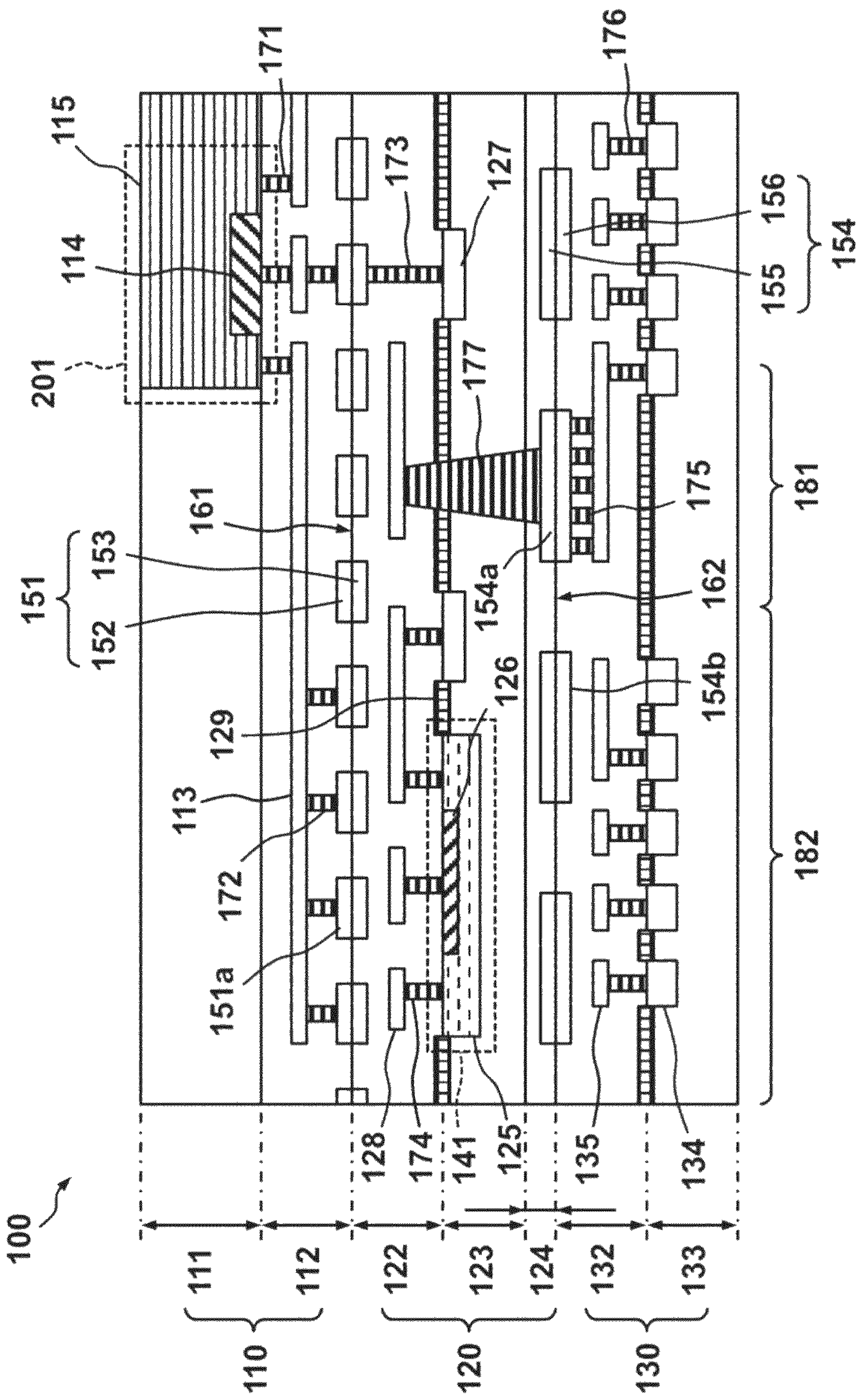
FIG. 7 is a sectional view showing an arrangement example of the photoelectric conversion apparatus shown in FIGS. 6A to 6D.
Figure 8A:
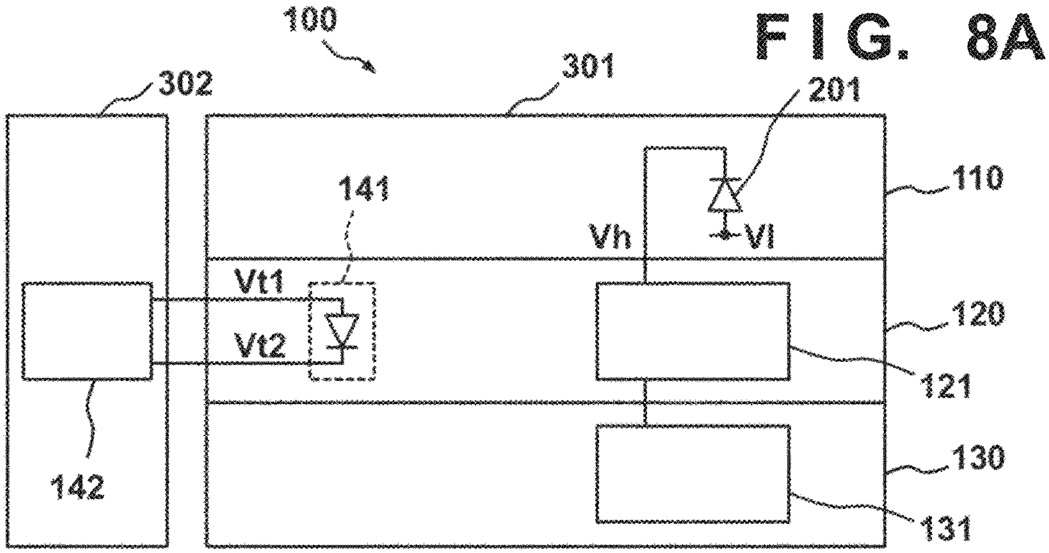
FIGS. 8A to 8D are views showing a modification of the photoelectric conversion apparatus shown in FIGS. 6A to 6D.
Figure 8B:
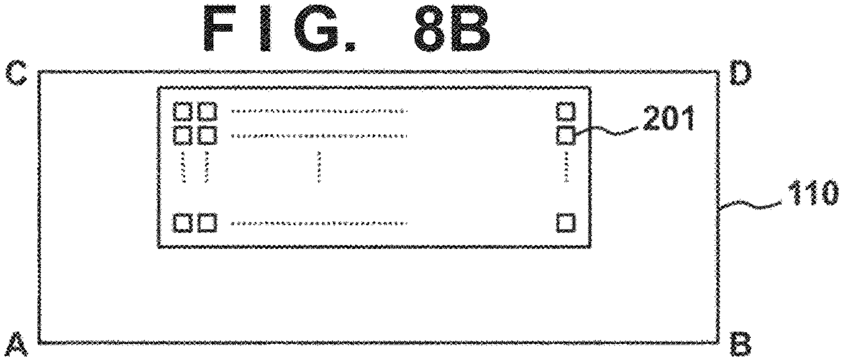
Figure 8C:
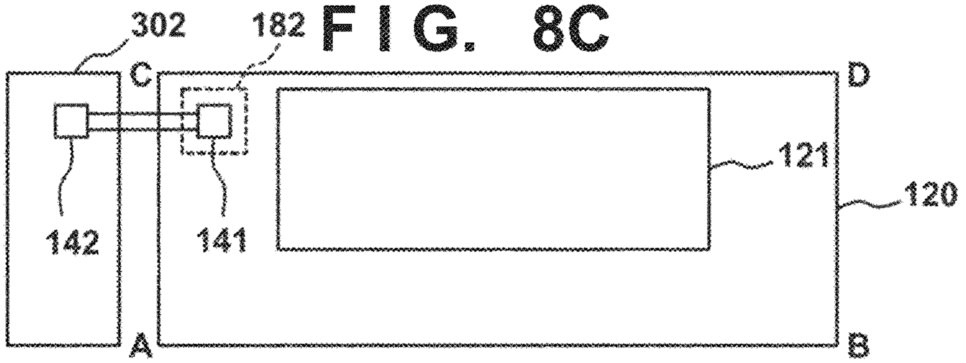
Figure 8D:
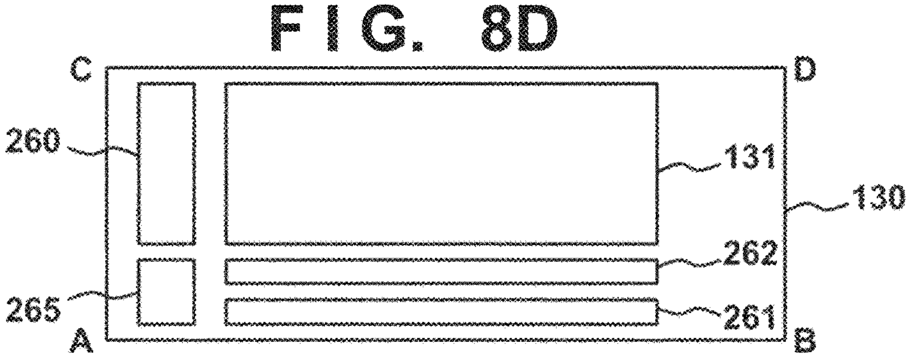
Figure 9A:
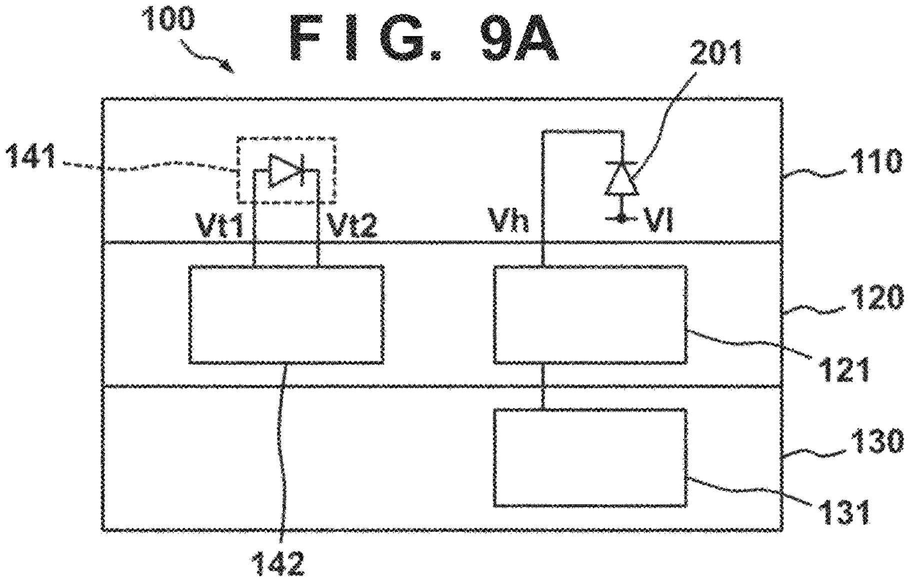
FIGS. 9A to 9D are views showing a modification of the photoelectric conversion apparatus shown in FIGS. 6A to 6D.
Figure 9B:
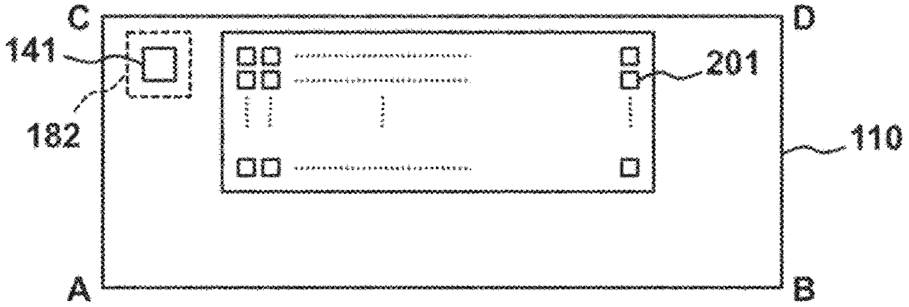
Figure 9C:
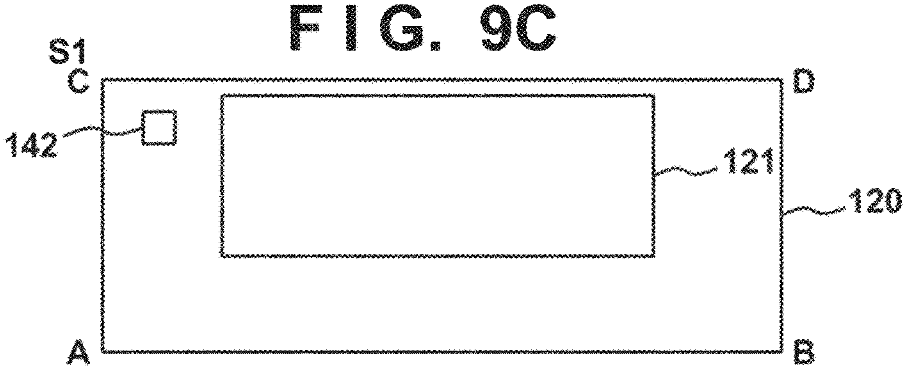
Figure 9D:
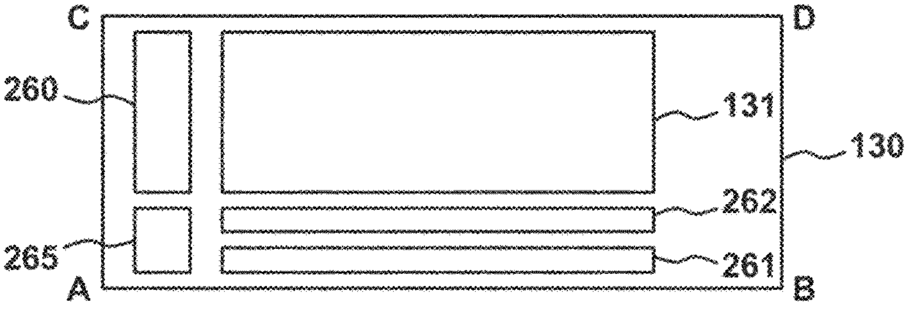

FIG. 7 is a sectional view showing a more detailed arrangement example of the photoelectric conversion apparatus 100 shown in FIGS. 6A to 6D. The substrate 110 includes a semiconductor layer 111, and an insulating layer 112 arranged between the semiconductor layer 111 and the substrate 120. Wiring patterns 113 and the like may be arranged in the insulating layer 112. In the arrangement shown in FIG. 7, the wiring patterns 113 arranged in one layer are shown, but the wiring patterns may be arranged across a plurality of layers. The substrate 120 includes a semiconductor layer 123, an insulating layer 122 arranged between the semiconductor layer 123 and the substrate 110, and an insulating layer 124 arranged between the semiconductor layer 123 and the substrate 130. Wiring patterns 128 and the like may be arranged in the insulating layer 122. In the arrangement shown in FIG. 7, the wiring patterns 128 arranged in one layer are shown, but the wiring patterns may be arranged across a plurality of layers. In the arrangement shown in FIG. 7, no wiring pattern is arranged in the insulating layer 124, but wiring patterns of one or more layers may be arranged in the insulating layer 124. The substrate 130 includes a semiconductor layer 133, and an insulating layer 132 arranged between the semiconductor layer 133 and the substrate 120. Wiring patterns 135 and the like may be arranged in the insulating layer 132. In the arrangement shown in FIG. 7, the wiring patterns 135 arranged in one layer are shown, but the wiring patterns may be arranged across a plurality of layers.

The substrate 110 and the substrate 120 are bonded via a plurality of bonded portions 151. In each of the plurality of bonded portions 151, a metal pattern 152 arranged in the surface of the insulating layer 112 facing the substrate 120 is in contact with a metal pattern 153 arranged in the surface of the insulating layer 122 facing the substrate 110. The surface of the insulating layer 112 facing the substrate 120 and the surface of the insulating layer 122 facing the substrate 110 are bonded, thereby forming a bonded face 161. The substrate 120 and the substrate 130 are bonded via a plurality of bonded portions 154. In each of the plurality of bonded portions 154, a metal pattern 155 arranged in the surface of the insulating layer 124 facing the substrate 130 is in contact with a metal pattern 156 arranged in the surface of the insulating layer 132 facing the substrate 120. The surface of the insulating layer 124 facing the substrate 130 and the surface of the insulating layer 132 facing the substrate 120 are bonded, thereby forming a bonded face 162.

The APD 201 is formed in the insulating layer 111 of the substrate 110. The APD 201 includes a semiconductor region 114 and a semiconductor region 115 of different polarities. The APD 201 is connected to a power supply, the signal processing circuits 121 and 131, and the like via metal plugs 171, the wiring patterns 113, and the like. For example, the APD 201 is connected to a semiconductor region 127 in the semiconductor layer 123 of the substrate 120 via the metal plug 171, the wiring pattern 113, and the bonded portion 151 arranged in the insulating layer 112 of the substrate 110, and a metal plug 173 arranged in the insulating layer 122 of the substrate 120. The semiconductor region 127 may form a part of the circuit such as the transistor of the signal processing circuit 121.

The temperature detection element 141 is formed in the semiconductor layer 123 of the substrate 120. The temperature detection element 141 may be, for example, a diode including a semiconductor region 125 and a semiconductor region 126 of different polarities. The temperature detection element 141 is connected to the temperature value generation circuit 142 via metal plugs 174, the wiring patterns 128, and the like. In this embodiment, a diode is used as the temperature detection element 141, but the temperature detection element 141 is not limited to this. For example, the temperature detection element 141 may be configured to measure the potential between two terminals of a resistance element having a temperature characteristic such as a resistance element using polysilicon, TaSiN, or the like.

Next, the arrangement position of the temperature detection element 141 will be described. As has been described above, to detect the temperature around the APD 201, the heat generated by the circuit and the like arranged in the substrate 130 should not be easily transferred to the temperature detection element 141. In general, a metal plug arranged in an insulating layer transfers heat more easier than the insulating layer (insulator). Therefore, the bonded face 162 between the substrate 120 and the substrate 130 includes a region 181 where, among the bonded portions 154, one or more bonded portions 154*a* in contact with metal plugs 175 and 177 are arranged, and a region 182 where, among the bonded portions 154, one or more bonded portions 154*b* in contact with no metal plug are arranged. In this case, in the orthogonal projection to the bonded face 162, the temperature detection element 141 is arranged at a position overlapping the region 182. In other words, in the orthogonal projection to the bonded face 162 between the substrate 120 and the substrate 130, no plug is in contact with, among the plurality of bonded portions 154, the bonded portion 154*b* arranged at a position overlapping the temperature detection element 141. With this arrangement, heat is not easily transferred from the substrate 130 to the temperature detection element 141 arranged in the substrate 120. As a result, the temperature detection accuracy can be improved. Here, the outer edge of the temperature detection element 141 in the orthogonal projection to the bonded face 162 can be defined by the inner edge of an element isolating insulating layer 129 surrounding the temperature detection element 141. The boundary between the region 181 and the region 182 may be, for example, a virtual line that halves the portion between the bonded portion 154*a* in contact with the metal plugs 175 and 177 and the bonded portion 154*b* in contact with no metal plug in the orthogonal projection to the bonded face 162, as shown in FIG. 7.

In the arrangement shown in FIG. 7, the metal plug 177 is shown as a TSV structure extending through the semiconductor layer 123 of the substrate 120. However, the metal plug 177 is not limited to this, and may be a metal plug that connects the semiconductor layer 123 and the bonded portion 154*a*, like the metal plug 173 and the like. For example, a signal processed by the signal processing circuit 121 is transmitted to a semiconductor region 134 provided in the semiconductor layer 133 of the substrate 130 from the bonded portion 154*a* via the metal plugs 175, the wiring pattern 135, and a metal plug 176. The semiconductor region 134 may form, for example, a part of the signal processing circuit 131 such as the transistor of the signal processing circuit 131. In addition, for example, the semiconductor region 134 may form a part of each circuit such as the transistor of each of the vertical scanning circuit 260, the horizontal scanning circuit 261, the readout circuit 262, the output circuit 264, and the control pulse generation circuit 265.

As shown in FIG. 7, in the orthogonal projection to the bonded faces 161 and 162, among the bonded portions 151 between the substrate 110 and the substrate 120, a bonded portion 151*a* arranged at a position overlapping the temperature detection element 141 may include a bonded portion in contact with a metal plug 172. With this arrangement, the temperature around the APD 201 is easily transferred to the temperature detection element 141. As a result, the temperature detection accuracy can be further improved.

The bonded portion 151*a* in contact with the metal plug 172 may be electrically connected to the wiring pattern 113 arranged in the insulating layer 112 of the substrate 110 via the metal plug 172. The wiring pattern 113 may further be electrically connected to the APD 201. When the bonded portion 151*a* is connected to the APD 201 via the metal plug 172, the wiring pattern 113, and the metal plug 171, the temperature of the APD 201 is easily transferred to the temperature detection element 141. Then, the temperature detection accuracy can be further improved. The wiring pattern 113 electrically connected to the bonded portion

151*a* may be, for example, a wiring pattern supplied with a potential VH shown in FIG. 4.

FIGS. 8A to 8D are views showing a modification of the photoelectric conversion apparatus 100 described with reference to FIGS. 6A to 6D. In the arrangement shown in FIGS. 6A to 6D, the temperature value generation circuit 142 is arranged in the substrate 120. However, the present invention is not limited to this. In the arrangement shown in FIGS. 8A to 8D, the temperature value generation circuit 142 is arranged in a chip 302 different from a chip 301 where the substrate 110, the substrate 120, and the substrate 130 are stacked. The remaining arrangement may be similar to the arrangement described above.

The temperature value generation circuit 142 is arranged in the chip 302 different from the chip 301 including the substrate 120. With this arrangement, the number of elements arranged in the substrate 120 can be reduced. In the arrangement shown in FIGS. 6A and 6C and the arrangement shown in FIGS. 8A and 8C, only one combination of the temperature detection element 141 and the temperature value generation circuit 142 is shown. However, a plurality of combinations each including the temperature detection element 141 and the temperature value generation circuit 142 may be arranged in the photoelectric conversion apparatus 100 (substrate 120). In this case, by arranging the temperature value generation circuit 142 in the chip 302 different from the chip 301 (substrate 120) where the temperature detection element 141 is arranged, the design of the substrate 120 can be facilitated.

FIGS. 9A to 9D are views showing a modification of the photoelectric conversion apparatus 100 described with reference to FIGS. 6A to 6D. In the arrangement shown in FIGS. 6A to 6D, the temperature detection element 141 is arranged in the substrate 120. However, the arrangement of the temperature detection element 141 is not limited to this. In the arrangement shown in FIGS. 9A to 9D, the temperature detection element 141 is arranged in the substrate 110. The remaining arrangement may be similar to the arrangement described above.

Figure 10:
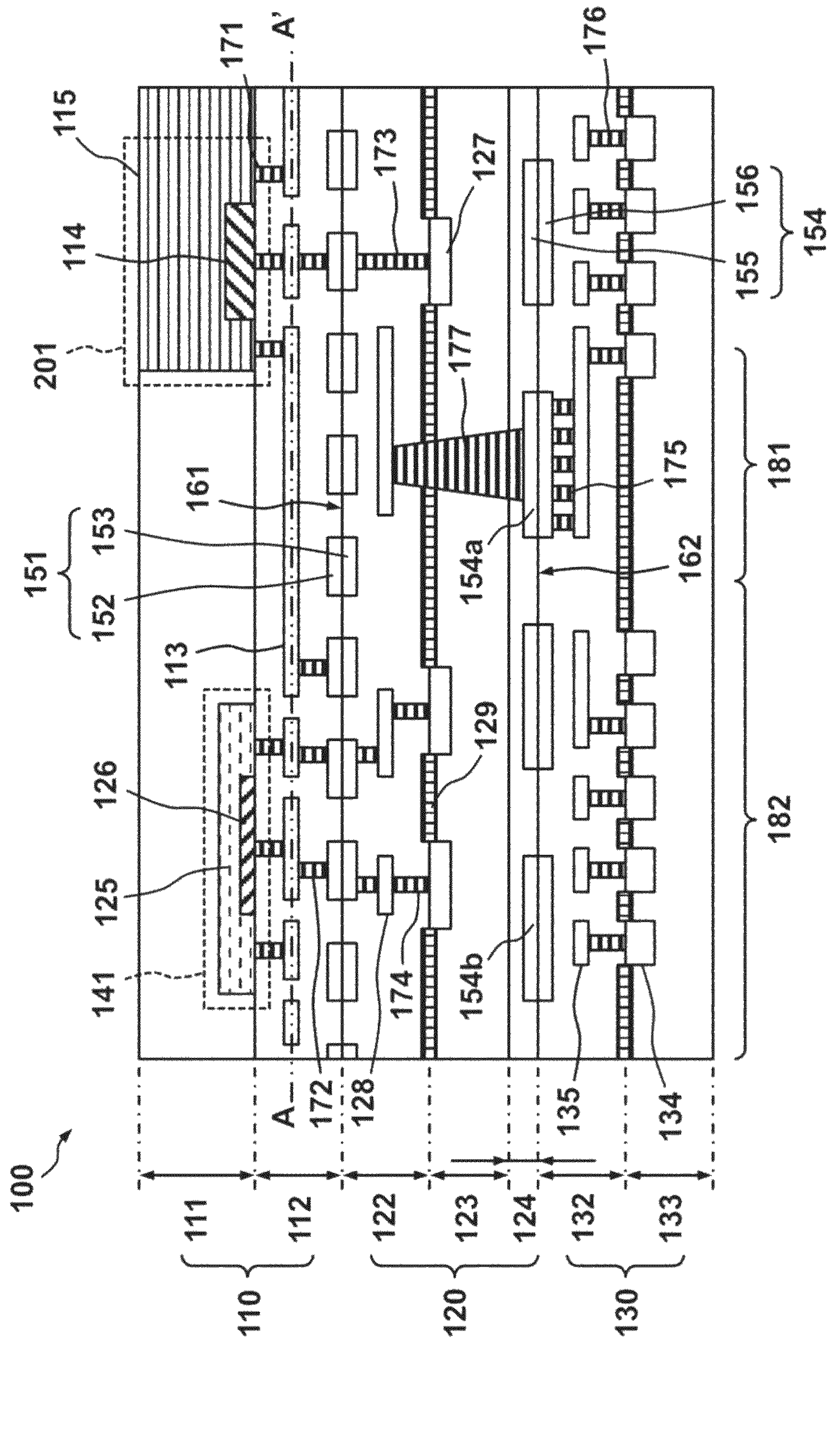
FIG. 10 is a sectional view showing an arrangement example of the photoelectric conversion apparatus shown in FIGS. 9A to 9D.

FIG. 10 is a sectional view showing a more detailed arrangement example of the photoelectric conversion apparatus 100 shown in FIGS. 9A to 9D. As shown in FIG. 10, the temperature detection element 141 shown as a diode including the semiconductor region 125 and the semiconductor region 126 of different polarities is formed in the semiconductor layer 111 of the substrate 110. By arranging the temperature detection element 141 in the substrate 110 where the APD 201 is arranged, the temperature detection accuracy can be improved.

The temperature value generation circuit 142 may be arranged in the substrate 120 as shown in FIGS. 9A to 9D and 10. With this arrangement, a process suitable for forming the diodes such as the APD 201 and the temperature detection element 141 can be employed for the substrate 110. The temperature detection element 141 is electrically connected to the semiconductor region 127, which forms a part of the temperature value generation circuit 142, in the semiconductor layer 123 of the substrate 120 via the metal plugs 171 to 174, the wiring patterns 113 and 128, the bonded portion 151, and the like.

Also in the arrangement shown in FIG. 10, in the orthogonal projection to the bonded face 162 between the substrate 120 and the substrate 130, the temperature detection element 141 is arranged at a position overlapping the region 182 where, among the bonded portions 154, one or more bonded portions 154*b* in contact with no metal plug are arranged. In other words, in the orthogonal projection to the bonded face 162 between the substrate 120 and the substrate 130, no plug is in contact with, among the plurality of bonded portions 154, the bonded portion 154*b* arranged at a position overlapping the temperature detection element 141. With this arrangement, heat is not easily transferred from the substrate 130 to the temperature detection element 141 arranged in the substrate 110 via the substrate 120.

Figure 11:
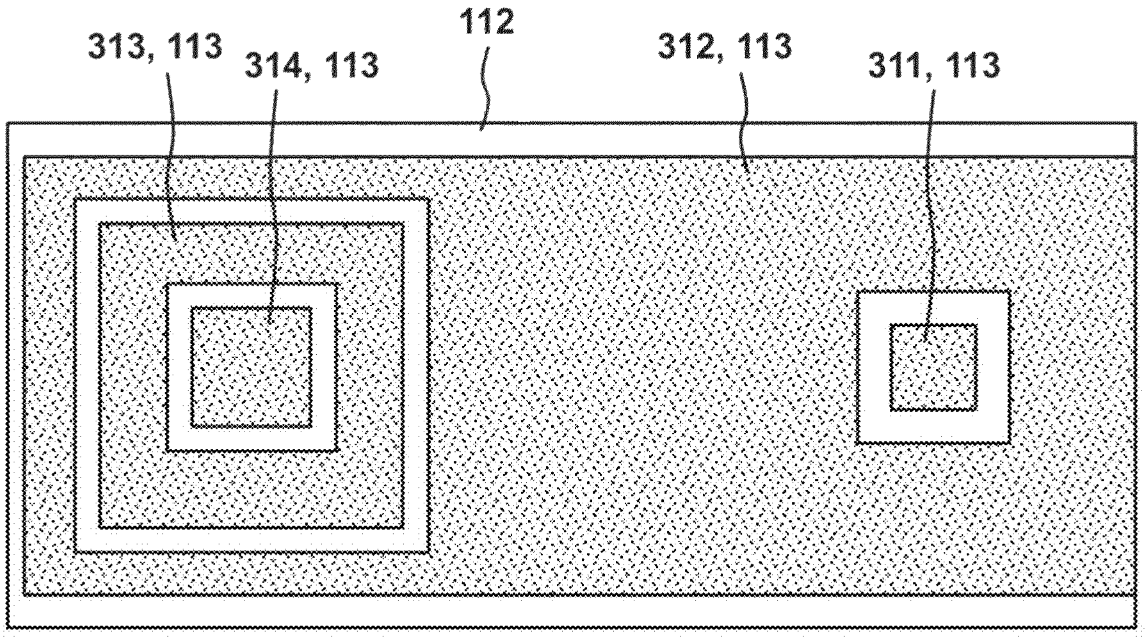
FIG. 11 is a plan view of the photoelectric conversion apparatus taken along a line A-A' in FIG. 10.
Figure 12A:
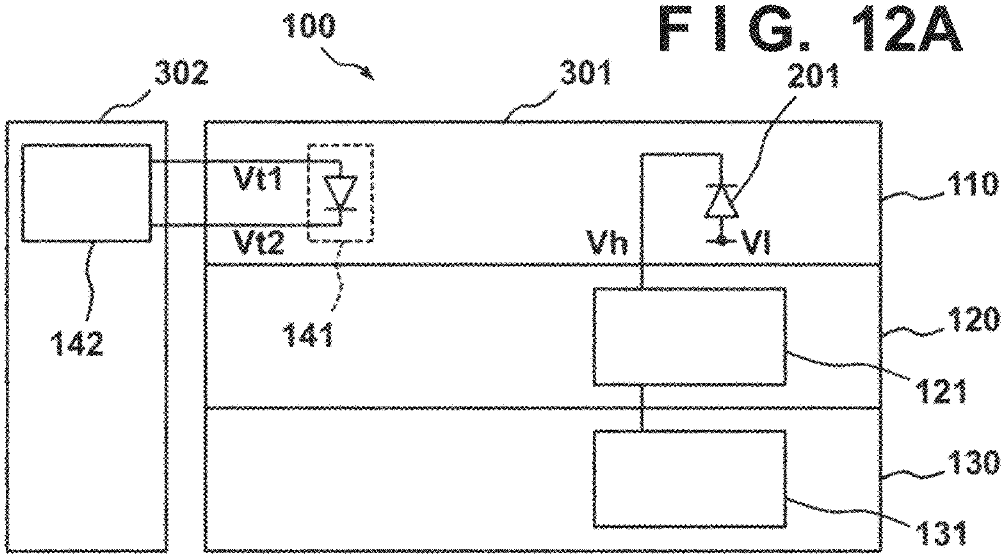
FIGS. 12A to 12D are views showing a modification of the photoelectric conversion apparatus shown in FIGS. 9A to 9D.
Figure 12B:
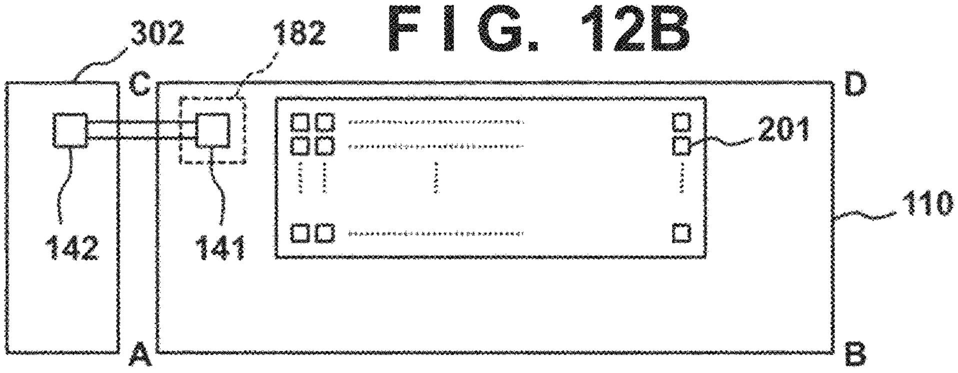
Figure 12C:
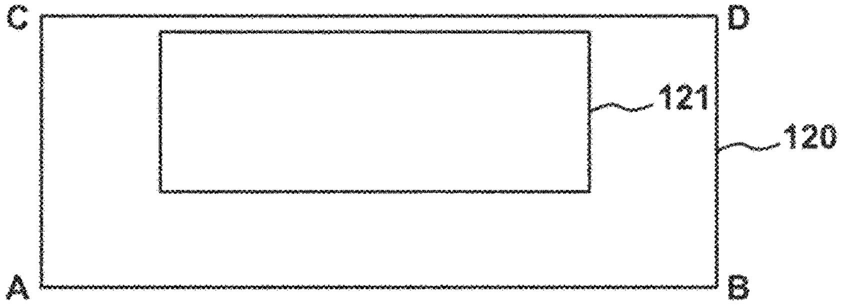
Figure 12D:

Alternatively, as shown in FIG. 11, the wiring pattern electrically connected to the APD 201 may be arranged so as to surround at least a part of the wiring pattern electrically connected to the temperature detection element 141. FIG. 11 is a plan view taken along a line A-A' in FIG. 10 and focusing on the wiring patterns 113 arranged in the insulating layer 112 of the substrate 110. A wiring pattern 311 is a wiring pattern connected to the semiconductor region 114 forming the APD 201 among the wiring patterns 113. A wiring pattern 312 may be, for example, a wiring pattern supplied with the potential VL shown in FIG. 4. The wiring pattern 312 is a wiring pattern connected to the semiconductor region 115 forming the APD 201 among the wiring patterns 113. The wiring pattern 312 may be, for example, a wiring pattern supplied with the potential VH shown in FIG. 4. A wiring pattern 313 is a wiring pattern connected to the semiconductor region 125 forming the temperature detection element 141 among the wiring patterns 113. A wiring pattern 314 is a wiring pattern connected to the semiconductor region 126 forming the temperature detection element 141 among the wiring patterns 113.

The wiring pattern 312 extends to the periphery of the temperature detection element 141 so as to surround the wiring patterns 313 and 314 connected to the temperature detection element 141. With this arrangement, the temperature of the APD 201 is easily transferred to the vicinity of the temperature detection element 141. As a result, the temperature detection accuracy can be improved.

FIGS. 12A to 12D are views showing a modification of the photoelectric conversion apparatus 100 described with reference to FIGS. 9A to 9D. As in the arrangement shown in FIGS. 8A to 8D, the temperature value generation circuit 142 may be arranged in the chip 302 different from the chip 301 where the substrate 110, the substrate 120, and the substrate 130 are stacked. The remaining arrangement may be similar to the arrangement described above.

Figure 13:
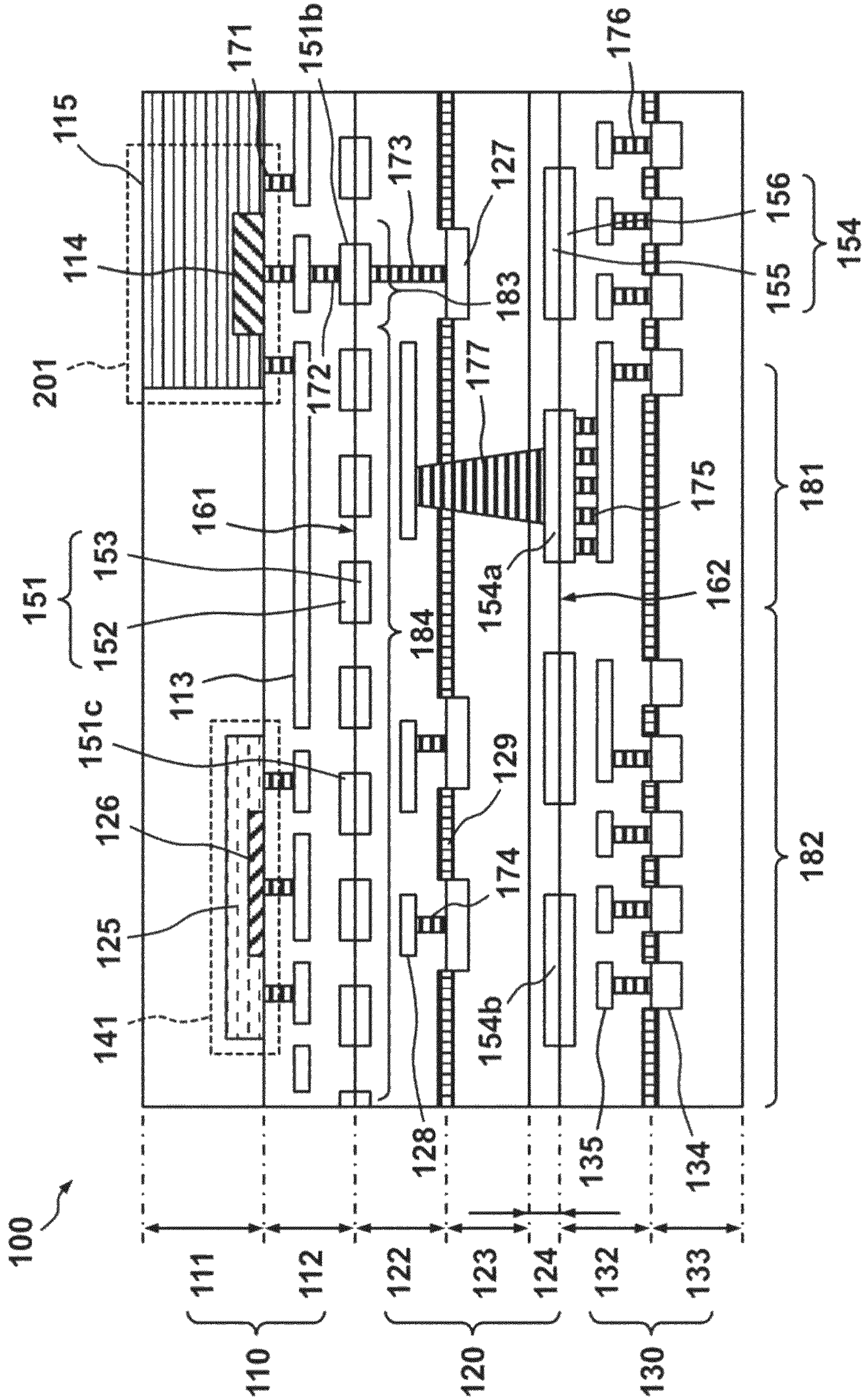
FIG. 13 is a sectional view showing an arrangement example of the photoelectric conversion apparatus shown in FIGS. 12A to 12D.

FIG. 13 is a sectional view showing a more detailed arrangement example of the photoelectric conversion apparatus 100 shown in FIGS. 12A to 12D. Also in the arrangement shown in FIG. 13, in the orthogonal projection to the bonded face 162 between the substrate 120 and the substrate 130, the temperature detection element 141 is arranged at a position overlapping the region 182 where, among the bonded portions 154, one or more bonded portions 154*b* in contact with no metal plug are arranged. In other words, in the orthogonal projection to the bonded face 162 between the substrate 120 and the substrate 130, no plug is in contact with, among the plurality of bonded portions 154, the bonded portion 154*b* arranged at a position overlapping the temperature detection element 141. With this arrangement, heat is not easily transferred from the substrate 130 to the temperature detection element 141 arranged in the substrate 110 via the substrate 120.

Furthermore, in the arrangement shown in FIG. 13, the bonded face 161 between the substrate 110 and the substrate 120 includes a region 183 where, among the bonded portions 151, one or more bonded portions 151*b* in contact with the metal plugs 172 and 173 are arranged, and a region 184 where, among the bonded portions 151, one or more bonded portions 151*c* in contact with no metal plug are arranged. In this case, in the orthogonal projection to the bonded faces 161 and 162, the temperature detection element 141 is arranged at a position overlapping the region 184. In other words, in the orthogonal projection to the bonded face 161 between the substrate 110 and the substrate 120, no plug is in contact with, among the plurality of bonded portions 151, the bonded portion 151*c* arranged at a position overlapping the temperature detection element 141. With this arrangement, heat is even less easily transferred from the substrate 130 to the temperature detection element 141 arranged in the substrate 110 via the substrate 120.

In each arrangement described above, the arrangement of the photoelectric conversion apparatus 100 having the three-layer structure has been described. However, the photoelectric conversion apparatus 100 is not limited to the three-layer structure. The photoelectric conversion apparatus 100 may have a two-layer structure, or may be formed by stacking four or more substrates. If four or more substrates are stacked, for example, an additional substrate can be stacked on the lower side (the side opposite to the substrates 110 and 120) of the substrate 130 shown in FIG. 6A. Further, in FIGS. 6A to 9D, examples have been described in which, in the three-layer structure, the circuit for processing signals output from the substrate 110 is arranged across the substrate 120 and the substrate 130. However, the signal processing circuit may be arranged in the substrate 120 alone. In this case, for example, the memory for holding signals and the like can be arranged in the substrate 130. In this case, the temperature detection element 141 may be arranged in the substrate 110. With this arrangement, it becomes easy to arrange the temperature detection element 141 away from the signal processing circuit while detecting the temperature near the APD 201.

Figure 14A:
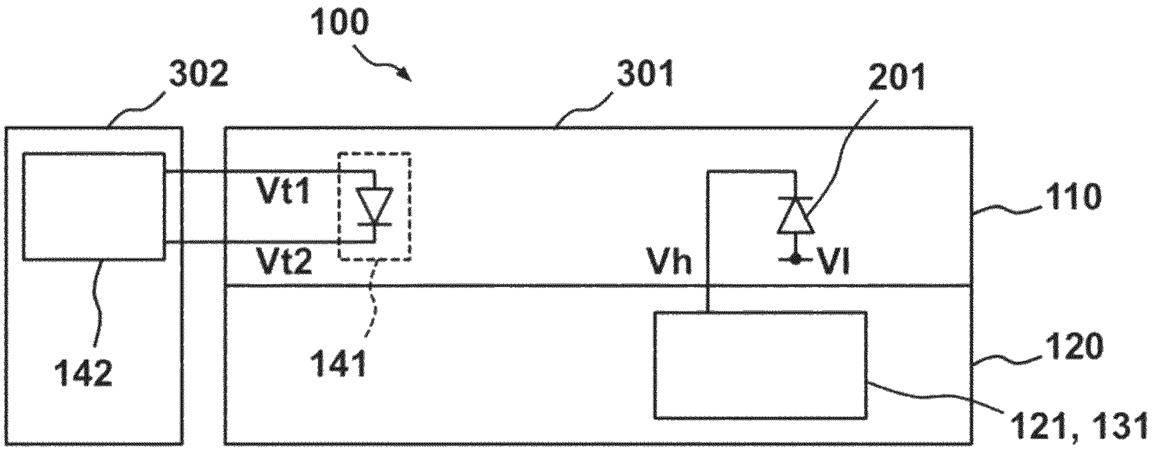
FIGS. 14A to 14C are views showing a modification of the photoelectric conversion apparatus shown in FIGS. 6A to 6D.
Figure 14B:
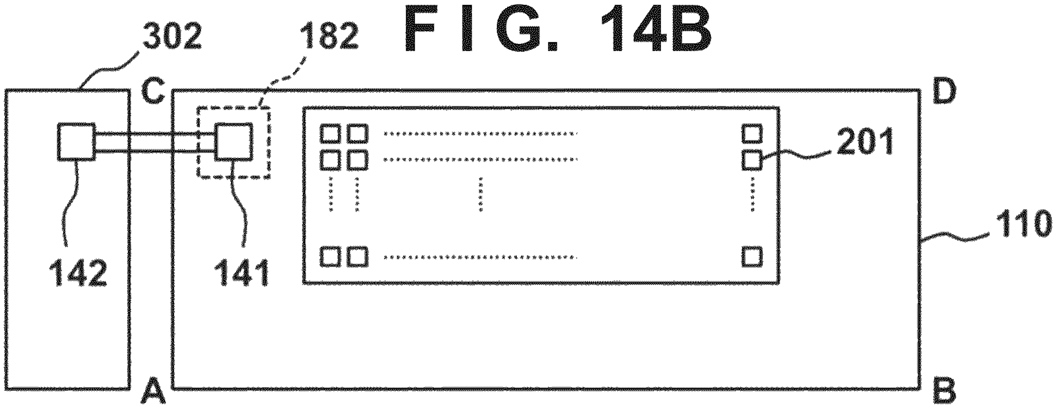
Figure 14C:
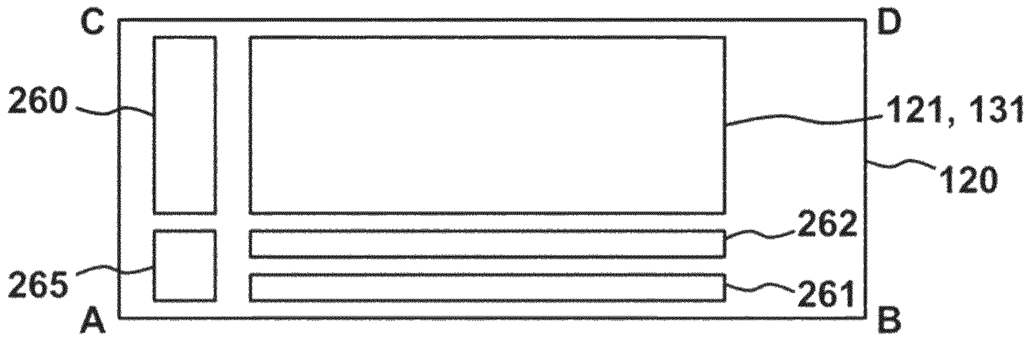
Figure 15:
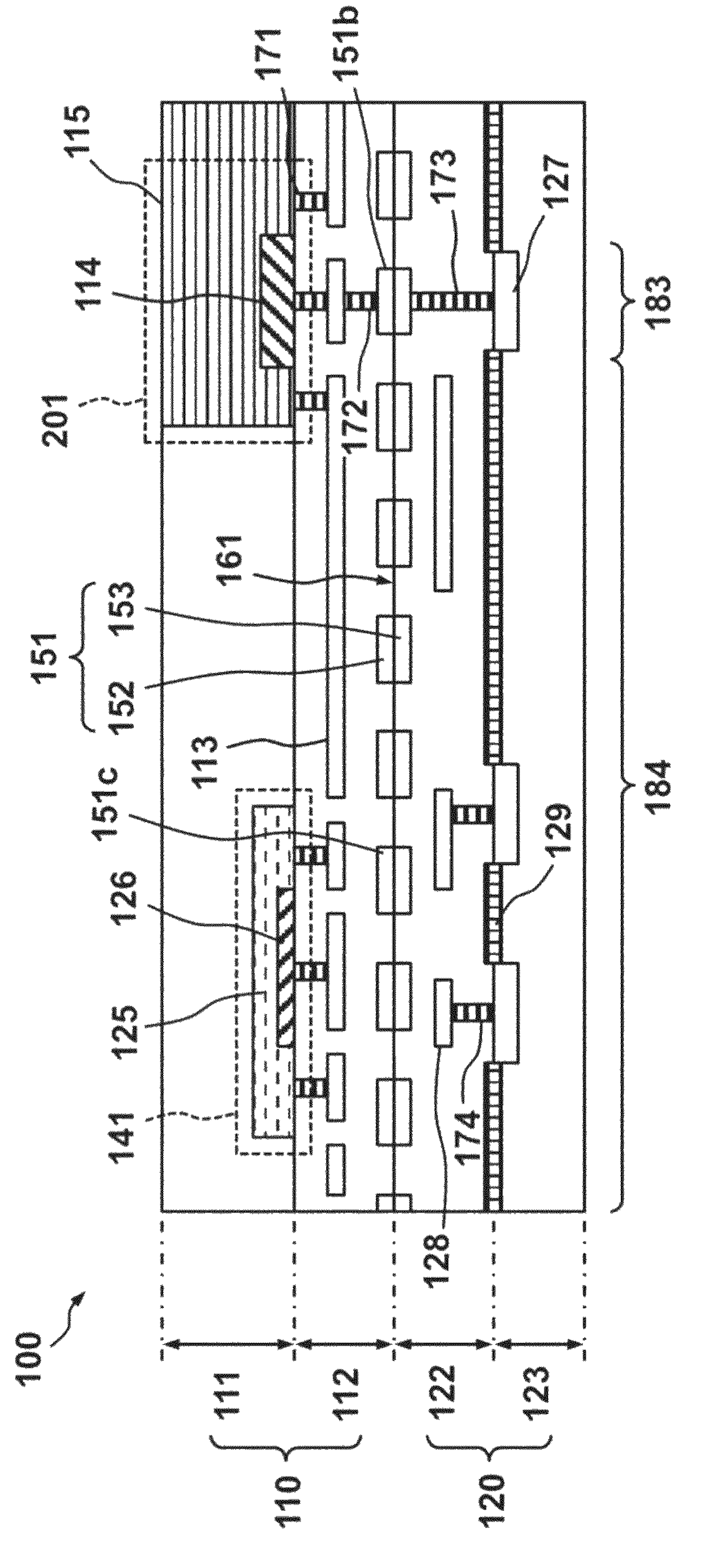
FIG. 15 is a sectional view showing an arrangement example of the photoelectric conversion apparatus shown in FIGS. 14A to 14C.

FIGS. 14A to 14C and 15 show an arrangement example of the photoelectric conversion apparatus 100 having a two-layer structure. FIGS. 14A to 14C are views showing an arrangement example of the temperature detection element 141 of the photoelectric conversion apparatus 100. FIG. 14A shows the photoelectric conversion apparatus 100 where two substrates 110 and 120 are stacked. FIGS. 14B and 14C show an arrangement example of main circuits in the substrates 110 and 120. FIG. 15 is a sectional view showing a more detailed arrangement example of the photoelectric conversion apparatus 100 shown in FIGS. 14A to 14C. If the photoelectric conversion apparatus 100 has a two-layer structure including the substrate 110 and the substrate 120, as shown in FIG. 14C, for example, the circuits arranged in the substrates 120 and 130 in the above-described three-layer structure may be arranged in one substrate 120. The remaining arrangement may be similar to the arrangement described above.

If the photoelectric conversion apparatus 100 has the two-layer structure, the temperature detection element 141 can be arranged in the semiconductor layer 111 of the substrate 110. In addition, the temperature value generation circuit 142 can be arranged in the chip 302 different from the chip 301 where the substrate 110 and the substrate 120 are stacked. In this case, in the orthogonal projection to the bonded face 161 between the substrate 110 and the substrate 120, the temperature detection element 141 is arranged at a position overlapping the region 184 where, among the bonded portions 151, one or bonded portions 151*c* in contact with no metal plug are arranged. In other words, in the orthogonal projection to the bonded face 161 between the substrate 110 and the substrate 120, no metal plug is in contact with, among the plurality of bonded portions 151, the bonded portion 151*c* arranged at a position overlapping the temperature detection element 141. With this arrangement, even if the photoelectric conversion apparatus 100 has a two-layer structure, heat is not easily transferred from the substrate 120 to the temperature detection element 141 arranged in the substrate 110. That is, as compared to the case where the temperature detection element 141 is arranged at the position overlapping the region 183 where, among the bonded portions 151, the bonded portion 151*b* in contact with the metal plugs 172 and 173 is arranged, the temperature detection accuracy can be improved.

Application examples of the photoelectric conversion apparatus 100 according to the above-described embodiment will be described below.

Figure 16:
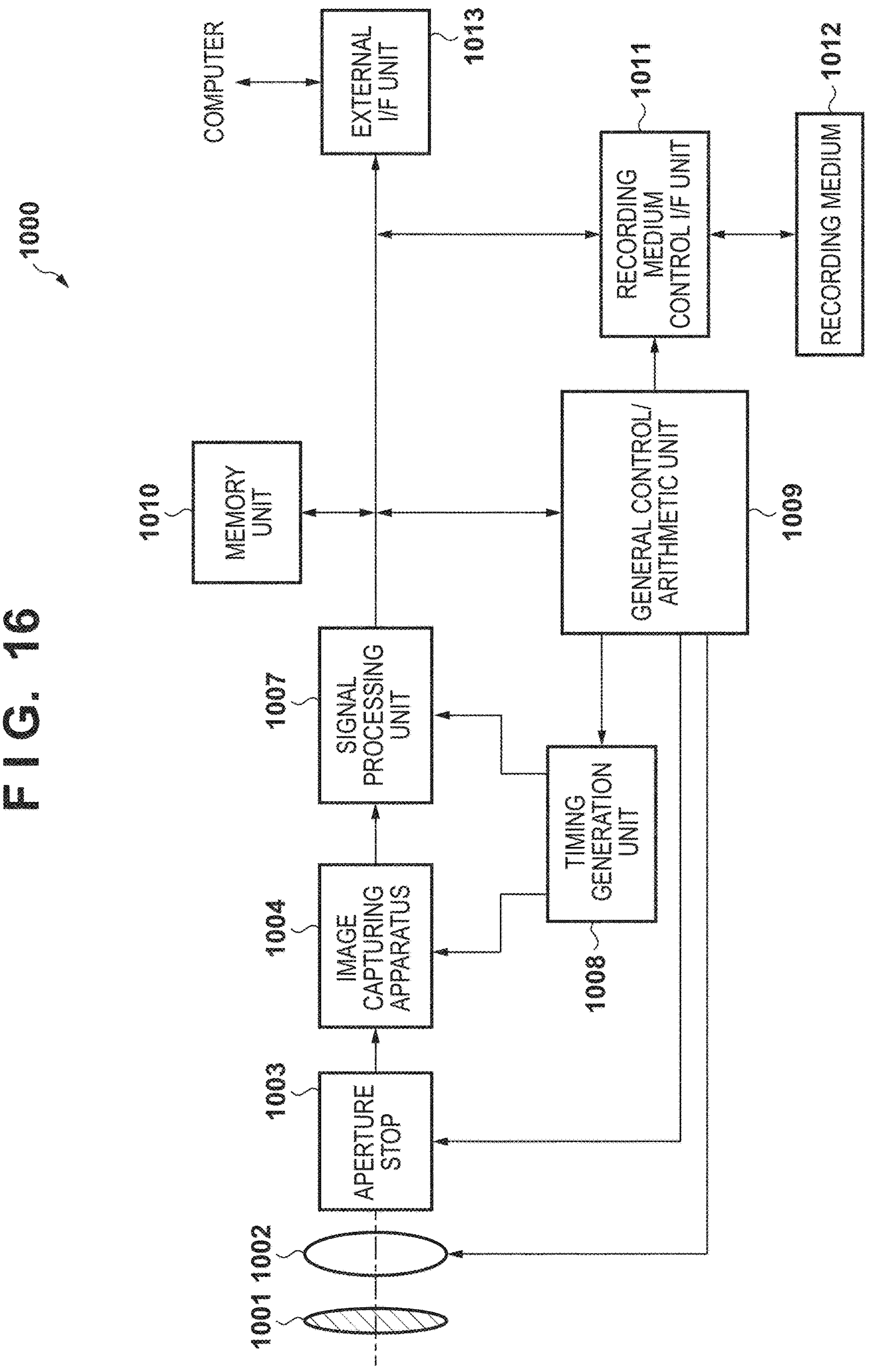
FIG. 16 is a functional block diagram of a photoelectric conversion system according to the second embodiment.

A photoelectric conversion system according to the second embodiment will be described with reference to FIG. 16. FIG. 16 is a block diagram showing the schematic arrangement of the photoelectric conversion system according to this embodiment.

The photoelectric conversion apparatus 100 described in the above embodiment is applicable to various kinds of photoelectric conversion systems. Examples of photoelectric conversion systems to which the photoelectric conversion apparatus is applicable are a digital still camera, a digital camcorder, a monitoring camera, a copying machine, a facsimile apparatus, a mobile phone, an in-vehicle camera, and an observation satellite. A camera module including an optical system such as a lens and an image capturing apparatus is also included in the photoelectric conversion systems. FIG. 16 exemplarily shows the block diagram of a digital still camera as an example of these.

A photoelectric conversion system 1000 exemplarily shown in FIG. 16 includes an image capturing apparatus 1004 as an example of the photoelectric conversion apparatus, a lens 1002 that forms an optical image of an object on the image capturing apparatus 1004, an aperture 1003 configured to change the amount of light passing through the lens 1002, and a barrier 1001 configured to protect the lens 1002. The lens 1002 and the aperture 1003 form an optical system (optical apparatus) that condenses light to the image capturing apparatus 1004. The image capturing apparatus 1004 is the photoelectric conversion apparatus 100 (image capturing apparatus) according to one of the above-described embodiments, and converts the optical image formed by the lens 1002 into an electrical signal.

The photoelectric conversion system 1000 also includes a signal processing unit 1007 that is an image generation unit configured to generate an image by processing an output signal output from the image capturing apparatus 1004. The signal processing unit 1007 functions as a processing apparatus that performs an operation of performing various kinds of correction and compression as needed, thereby outputting image data. The signal processing unit 1007 may be formed on a semiconductor substrate on which the image capturing apparatus 1004 is provided or may be formed on a semiconductor substrate different from the image capturing apparatus 1004. In addition, the image capturing apparatus 1004 and the signal processing unit 1007 may be formed on the same semiconductor substrate.

The photoelectric conversion system 1000 further includes a memory unit 1010 configured to temporarily store image data, and an external interface unit (external I/F unit) 1013 configured to communicate with an external computer or the like. Furthermore, the photoelectric conversion system 1000 includes a recording medium 1012 such as a semiconductor memory configured to record or read out image capturing data, and a recording medium control interface unit (recording medium control I/F unit) 1011 configured to perform record or readout for the recording medium 1012. The recording medium control I/F unit 1011 and the recording medium 1012 can form a part of a recording apparatus. Note that the recording medium 1012 may be incorporated in the photoelectric conversion system 1000 or may be detachable.

Furthermore, the photoelectric conversion system 1000 includes a general control/arithmetic unit 1009 that controls various kinds of operations and the entire digital still camera, and a timing generation unit 1008 that outputs various kinds of timing signals to the image capturing apparatus 1004 and the signal processing unit 1007. The general control/arithmetic unit 1009 and the timing generation unit 1008 can form a part of a control apparatus configured to control an operation of the photoelectric conversion system 1000. In this example, the timing signal and the like may be input from the outside, and the photoelectric conversion system 1000 need only include at least the image capturing apparatus 1004, and the signal processing unit 1007 that processes an output signal output from the image capturing apparatus 1004.

The image capturing apparatus 1004 outputs an image capturing signal to the signal processing unit 1007. The signal processing unit 1007 executes predetermined signal processing for the image capturing signal output from the image capturing apparatus 1004, and outputs image data. The signal processing unit 1007 generates an image using the image capturing signal. Although not shown in FIG. 16, a display apparatus such as a display for displaying the generated image may be arranged in the photoelectric conversion system 1000. As described above, according to this embodiment, it is possible to implement the photoelectric conversion system 1000 to which the photoelectric conversion apparatus 100 (image capturing apparatus) according to one of the above-described embodiments is applied.

Figure 17A:
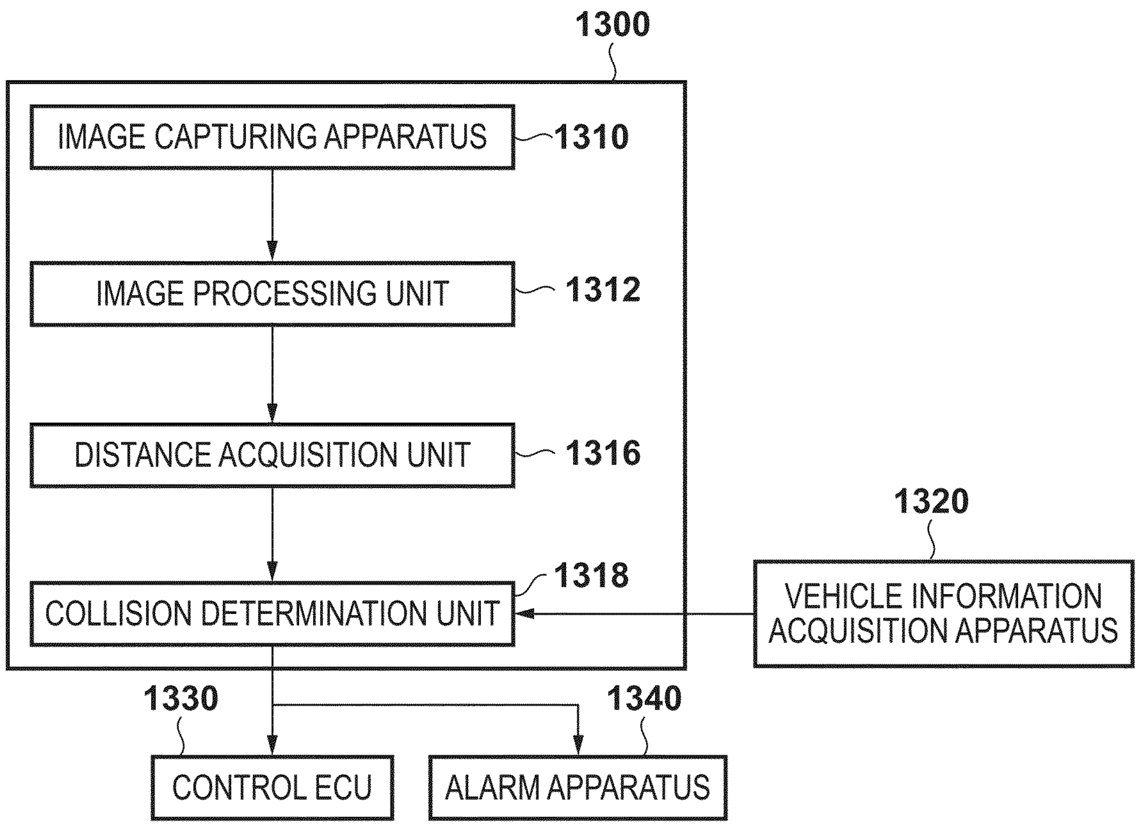
FIGS. 17A and 17B are functional block diagrams of a photoelectric conversion system according to the third embodiment.
Figure 17B:
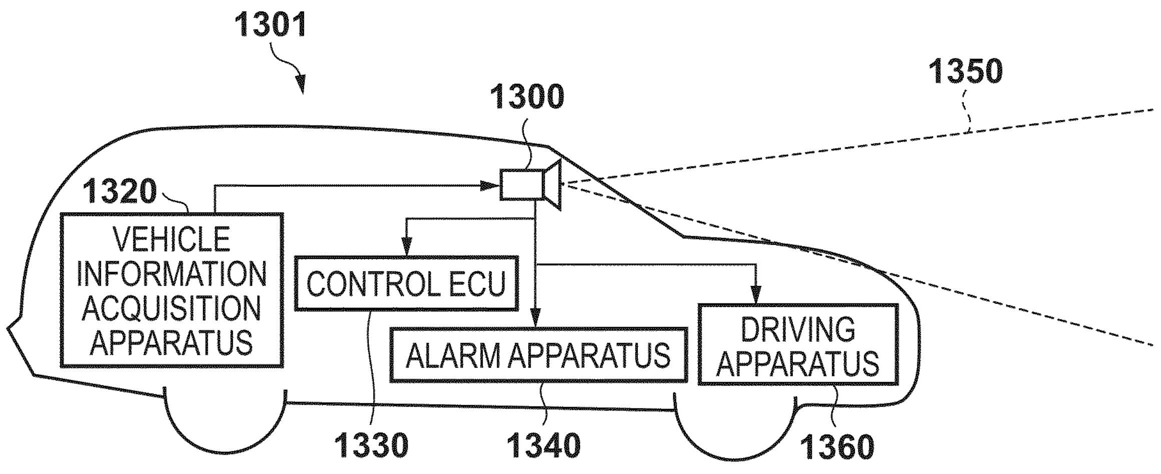

A photoelectric conversion system 1300 and a moving body 1301 according to the third embodiment will be described with reference to FIGS. 17A and 17B. FIGS. 17A and 17B are views showing the arrangement of the photoelectric conversion system 1300 and the moving body 1301 according to this embodiment.

FIG. 17A shows an example of a photoelectric conversion system concerning an in-vehicle camera. The photoelectric conversion system 1300 includes an image capturing apparatus 1310. The image capturing apparatus 1310 is the photoelectric conversion apparatus 100 (image capturing apparatus) described in one of the above-described embodiments. The photoelectric conversion system 1300 includes an image processing unit 1312 that performs image processing for a plurality of image data acquired by the image capturing apparatus 1310. The photoelectric conversion system 1300 also includes a distance acquisition unit 1316 that calculates the distance up to a target object, and a collision determination unit 1318 that determines, based on the calculated distance, whether there is collision possibility. Here, the distance acquisition unit 1316 may acquire distance information up to a target object by using Time of Flight (ToF) method, or may acquire distance information by using parallax information or the like. That is, the distance information is information concerning a parallax, a defocus amount, a distance up to a target object, and the like. The collision determination unit 1318 may determine collision possibility using one of the pieces of distance information. The distance acquisition unit 1316 may be implemented by exclusively designed hardware, or may be implemented by a software module. The distance acquisition unit 1316 may be implemented by a Field Programmable Gate Array (FPGA), Application Specific Integrated Circuit (ASIC), or the like, or may be implemented by a combination of these.

The photoelectric conversion system 1300 is connected to a vehicle information acquisition apparatus 1320, and can acquire vehicle information such as a vehicle speed, a yaw rate, and a steering angle. The photoelectric conversion system 1300 is also connected to an ECU 1330 that is a control apparatus configured to output a control signal for generating a braking force to the vehicle based on the determination result of the collision determination unit 1318. Furthermore, the photoelectric conversion system 1300 is connected to an alarm apparatus 1340 that generates an alarm to the driver based on the determination result of the collision determination unit 1318. For example, if collision possibility is high as the determination result of the collision determination unit 1318, the ECU 1330 controls a driving apparatus (machine apparatus) 1360 to perform braking, releasing the accelerator pedal, or suppressing the engine output, thereby controlling the vehicle for avoiding collision and reducing damage. The alarm apparatus 1340 sounds an alarm, displays alarm information on the screen of a car navigation system or the like, or applies a vibration to the seat belt or a steering wheel, thereby making an alarm to the user.

In this embodiment, the periphery of the vehicle (moving body 1301), for example, the front or rear side is captured by the photoelectric conversion system 1300. FIG. 17B shows the photoelectric conversion system when capturing the front side (image capturing range 1350) of the vehicle. The vehicle information acquisition apparatus 1320 sends an instruction to the photoelectric conversion system 1300 or the image capturing apparatus 1310. With this configuration, it is possible to further improve the accuracy of distance measurement.

An example in which control is executed so as not to collide with another vehicle has been explained above. The photoelectric conversion system 1300 can also be applied to control of performing automated driving following another vehicle or control of performing automated driving without deviating from a lane. Furthermore, the photoelectric conversion system 1300 can be applied not only to a vehicle such as an automobile but also to, for example, a moving body (moving apparatus) such as a ship, an airplane, or an industrial robot. The moving body includes one or both of a driving force generation unit that generates a driving force mainly used for moving the moving body and a rotating body mainly used for moving the moving body. The driving force generation unit can be an engine, a motor, or the like. The rotating body can be a tire, a wheel, a ship screw, an aircraft propeller, or the like. In addition, the photoelectric conversion system can be applied not only to a moving body but also to equipment that broadly uses object recognition, such as an intelligent transport system (ITS).

Figure 18:
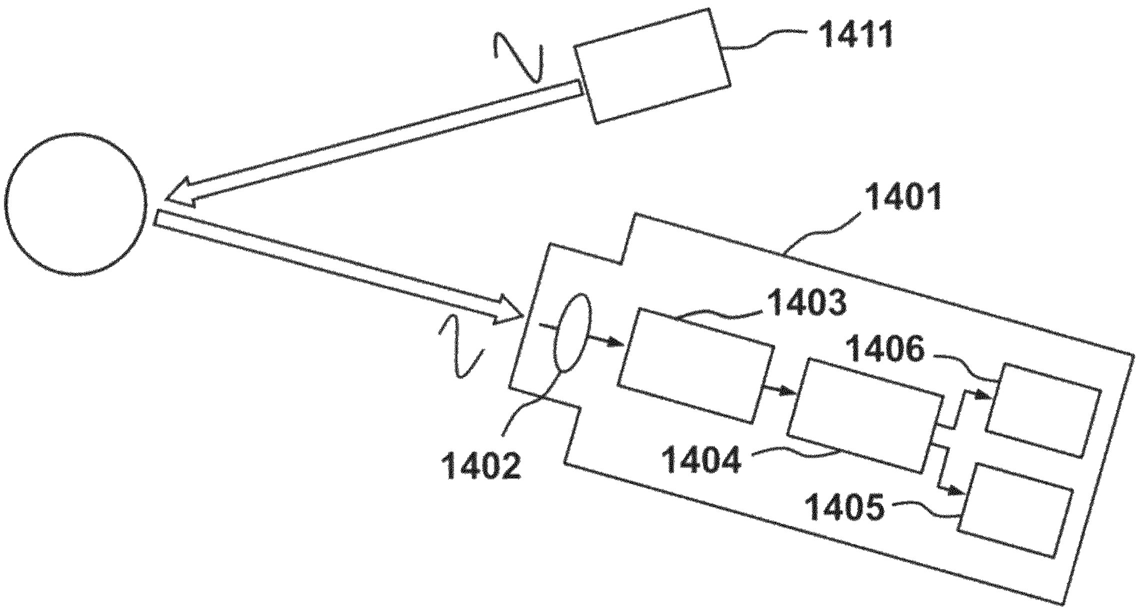
FIG. 18 is a functional block diagram of a photoelectric conversion system according to the fourth embodiment.

A photoelectric conversion system according to the fourth embodiment will be described with reference to FIG. 18. FIG. 18 is a block diagram showing an example of the arrangement of a distance image sensor 1401 as the photoelectric conversion system according to this embodiment.

As shown in FIG. 18, the distance image sensor 1401 includes an optical system 1402, a photoelectric conversion apparatus 1403, an image processing circuit 1404, a monitor 1405, and a memory 1406. Then, the distance image sensor 1401 can receive light (modulated light or pulsed light) projected from a light source apparatus 1411 toward an object and reflected by the surface of the object, thereby acquiring a distance image corresponding to the distance up to the object.

The optical system 1402 is formed by including one or a plurality of lenses, and guides image light (incident light) from the object to the photoelectric conversion apparatus 1403 and forms an image on the light-receiving surface (sensor portion) of the photoelectric conversion apparatus 1403.

As the photoelectric conversion apparatus 1403, the photoelectric conversion apparatus 100 of each of the above-described embodiments is applied, and a distance signal indicating a distance obtained from a light reception signal output from the photoelectric conversion apparatus 1403 is supplied to the image processing circuit 1404.

The image processing circuit 1404 performs image processing of creating a distance image based on the distance signal supplied from the photoelectric conversion apparatus 1403. Then, the distance image (image data) obtained by the image processing is supplied to and displayed on the monitor 1405, and supplied to and stored (recorded) in the memory 1406.

The distance image sensor 1401 having such arrangement can acquire, for example, a more correct distance image along with improvement in characteristic of pixels by applying the above-described photoelectric conversion apparatus 100.

Figure 19:
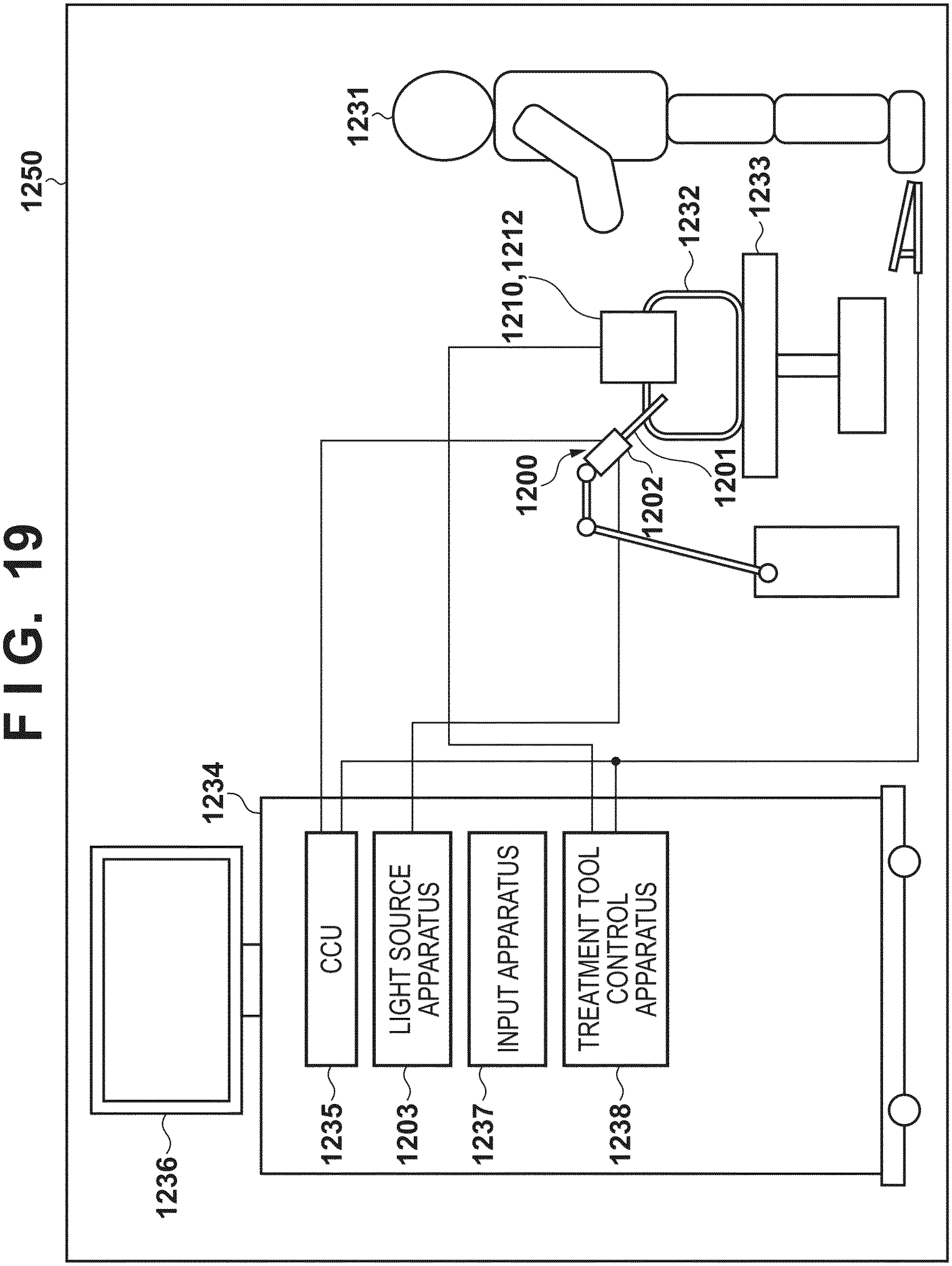
FIG. 19 is a functional block diagram of a photoelectric conversion system according to the fifth embodiment.

A photoelectric conversion system according to the fifth embodiment will be described with reference to FIG. 19. FIG. 19 is a view showing an example of the schematic arrangement of an endoscopic surgery system 1250 as the photoelectric conversion system according to this embodiment.

FIG. 19 shows a state in which an operator (doctor) 1231 operates on a patient 1232 on a patient bed 1233 using the endoscopic surgery system 1250. As shown in FIG. 19, the endoscopic surgery system 1250 is formed from an endoscope 1200, a surgical tool 1210, and a cart 1234 on which various apparatuses for endoscopic surgery are mounted.

The endoscope 1200 includes a lens barrel 1201 including a region of a predetermined length from the distal end, which is inserted into the body cavity of the patient 1232, and a camera head 1202 connected to the proximal end of the lens barrel 1201. In the example shown in FIG. 19, the endoscope 1200 formed as a so-called hard mirror including the hard lens barrel 1201 is shown but the endoscope 1200 may be formed as a so-called soft mirror including a soft lens barrel.

An opening in which an objective lens is fitted is provided at the distal end of the lens barrel 1201. A light source apparatus 1203 is connected to the endoscope 1200, and light generated by the light source apparatus 1203 is guided to the distal end of the lens barrel by a light guide extended inside the lens barrel 1201, and is emitted to an observation target in the body cavity of the patient 1232 via the objective lens. Note that the endoscope 1200 may be a forward-viewing endoscope or may be a forward-oblique viewing endoscope or side-viewing endoscope.

An optical system and a photoelectric conversion apparatus are provided in the camera head 1202, and reflected light (observation light) from the observation target is condensed by the optical system to the photoelectric conversion apparatus. The observation light is photoelectrically converted by the photoelectric conversion apparatus to generate an electrical signal corresponding to the observation light, that is, an image signal corresponding to an observation image. As the photoelectric conversion apparatus, the photoelectric conversion apparatus 100 (image capturing apparatus) described in each of the above-described embodiments can be used. The image signal is transmitted as RAW data to a Camera Control Unit (CCU) 1235.

The CCU 1235 is formed by a Central Processing Unit (CPU), a Graphics Processing Unit (GPU), and the like, and comprehensively controls the operations of the endoscope 1200 and a display apparatus 1236. Furthermore, the CCU 1235 receives an image signal from the camera head 1202, and performs, for the image signal, various kinds of image processes such as development processing (demosaic processing) for displaying an image based on the image signal.

Under the control of the CCU 1235, the display apparatus 1236 displays the image based on the image signal having undergone the image processing by the CCU 1235.

The light source apparatus 1203 is formed from a light source such as a Light Emitting Diode (LED), and supplies, to the endoscope 1200, irradiation light at the time of imaging an operation portion or the like.

An input apparatus 1237 is an input interface to the endoscopic surgery system 1250. The user can input various kinds of information or instructions to the endoscopic surgery system 1250 via the input apparatus 1237.

A treatment tool control apparatus 1238 controls driving of an energy treatment tool 1212 for ablation or incision of the tissue, sealing of a blood vessel, or the like.

The light source apparatus 1203 that supplies, to the endoscope 1200, irradiation light at the time of imaging an operation portion can be formed from, for example, a white light source formed by an LED, a laser light source, or a combination thereof. If the white light source is formed by a combination of RGB laser light sources, it is possible to accurately control the output intensity and output timing of each color (each wavelength), and thus the light source apparatus 1203 can adjust the white balance of a captured image. In this case, the observation target is time-divisionally irradiated with laser beams from the RGB laser light sources, respectively, and driving of the image sensor of the camera head 1202 is controlled in synchronism with the irradiation timings, thereby making it possible to time-divisionally capture images respectively corresponding to R, G, and B. In this method, it is possible to obtain a color image without providing color filters in the image sensor.

Driving of the light source apparatus 1203 may be controlled to change the intensity of light to be output for every predetermined time. It is possible to time-divisionally acquire images by controlling driving of the image sensor of the camera head 1202 in synchronism with the timing of changing the intensity of the light, and combine the images, thereby generating an image of a high dynamic range without so-called shadow detail loss or highlight detail loss.

The light source apparatus 1203 may be configured to supply light in a predetermined wavelength band corresponding to special light observation. In special light observation, for example, the wavelength dependency of light absorption in the body tissue is used. More specifically, by performing irradiation with light in a narrow band, as compared with irradiation light (that is, white light) at the time of normal observation, predetermined tissue such as a blood vessel in the mucous membrane surface layer is captured with high contrast. Alternatively, in special light observation, fluorescence observation for obtaining an image by using fluorescence generated by performing irradiation with excitation light may be performed. In fluorescence observation, it is possible to, for example, irradiate body tissue with excitation light and observe fluorescence from the body tissue, or locally inject a reagent such as indocyanine green (ICG) to body tissue while irradiating the body tissue with excitation light corresponding to the fluorescence wavelength of the reagent, thereby obtaining a fluorescence image. The light source apparatus 1203 can be configured to supply narrow band light and/or excitation light corresponding to such special light observation.

Figure 20A:
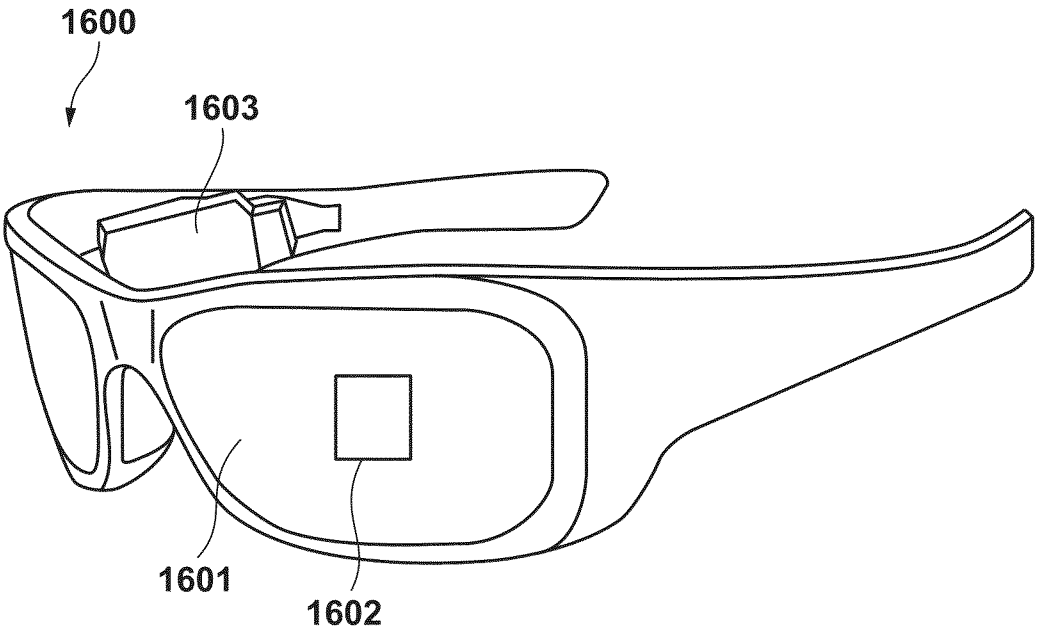
FIGS. 20A and 20B are functional block diagrams of a photoelectric conversion system according to the sixth embodiment.

A photoelectric conversion system according to the sixth embodiment will be described with reference to FIGS. 20A and 20B. FIG. 20A describes glasses 1600 (smartglasses) as the photoelectric conversion system according to this embodiment. The glasses 1600 include a photoelectric conversion apparatus 1602. The photoelectric conversion apparatus 1602 is the photoelectric conversion apparatus 100 (image capturing apparatus) described in each of the above embodiments. A display apparatus including the light emitting apparatus such as an OLED or LED may be provided on the back surface side of a lens 1601. One or a plurality of photoelectric conversion apparatuses 1602 may be provided. Alternatively, a plurality of kinds of photoelectric conversion apparatuses may be used in combination. The arrangement position of the photoelectric conversion apparatus 1602 is not limited to that shown in FIG. 20A.

The glasses 1600 further include a control apparatus 1603. The control apparatus 1603 functions as a power supply that supplies electric power to the photoelectric conversion apparatus 1602 and the above-described display apparatus. In addition, the control apparatus 1603 controls the operations of the photoelectric conversion apparatus 1602 and the display apparatus. An optical system configured to condense light to the photoelectric conversion apparatus 1602 is formed on the lens 1601.

Figure 20B:
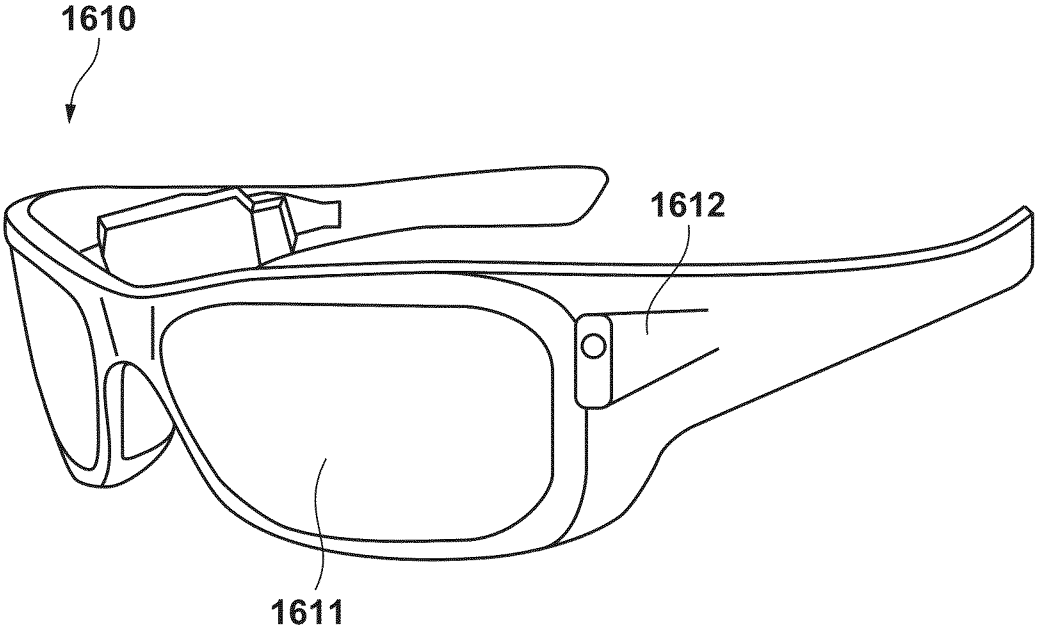

FIG. 20B describes glasses 1610 (smartglasses) according to an application example. The glasses 1610 include a control apparatus 1612, and a photoelectric conversion apparatus corresponding to the photoelectric conversion apparatus 1602 and a display apparatus are mounted on the control apparatus 1612. The photoelectric conversion apparatus in the control apparatus 1612 and an optical system configured to project light emitted from the display apparatus are formed in a lens 1611, and an image is projected to the lens 1611. The control apparatus 1612 functions as a power supply that supplies electric power to the photoelectric conversion apparatus and the display apparatus, and controls the operations of the photoelectric conversion apparatus and the display apparatus. The control apparatus may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a plan view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The display apparatus according to the embodiment can include a photoelectric conversion apparatus including a light receiving element, and control a displayed image of the display apparatus based on the line-of-sight information of the user from the photoelectric conversion apparatus.

More specifically, the display apparatus decides a first visual field region at which the user is gazing and a second visual field region other than the first visual field region based on the line-of-sight information. The first visual field region and the second visual field region may be decided by the control apparatus of the display apparatus, or those decided by an external control apparatus may be received. In the display region of the display apparatus, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority may be decided from the first display region and the second display region based on line-of-sight information. The first visual field region and the second visual field region may be decided by the control apparatus of the display apparatus, or those decided by an external control apparatus may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target object ahead the line of sight from the image of the eyeball using the image of the eyeball and the direction of actual viewing of the eyeball in the image as supervised data. The AI program may be held by the display apparatus, the photoelectric conversion apparatus, or an external apparatus. If the external apparatus holds the AI program, it is transmitted to the display apparatus via communication.

When performing display control based on line-of-sight detection, smartglasses further including a photoelectric conversion apparatus configured to capture the image of the outside can be applied. The smartglasses can display the captured outside image information in real time.

The seventh embodiment will be described with reference to FIGS. 21A and 21B. The above-described photoelectric conversion apparatus and photoelectric conversion system may be applied to, for example, electronic equipment such as a so-called smartphone or tablet.

Figure 21A:
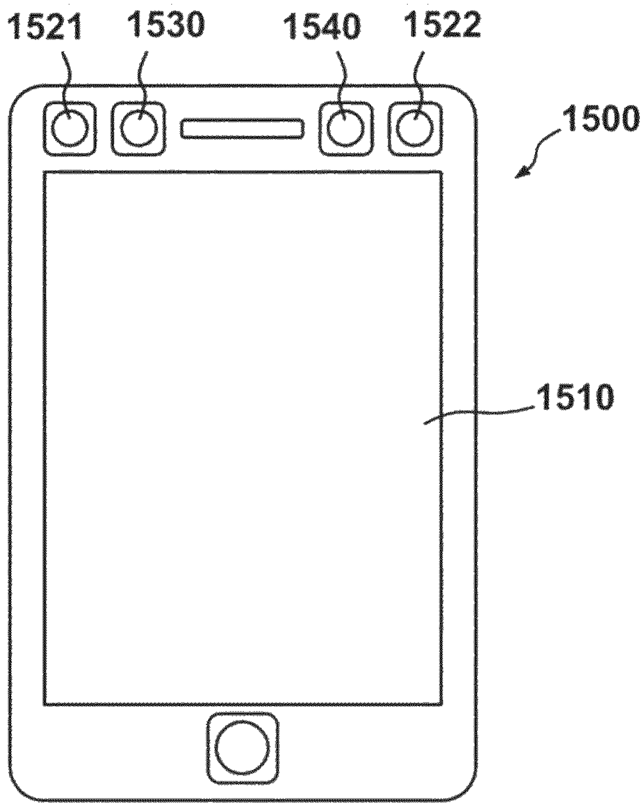
FIGS. 21A and 21B are functional block diagrams of a photoelectric conversion system according to the seventh embodiment.
Figure 21B:
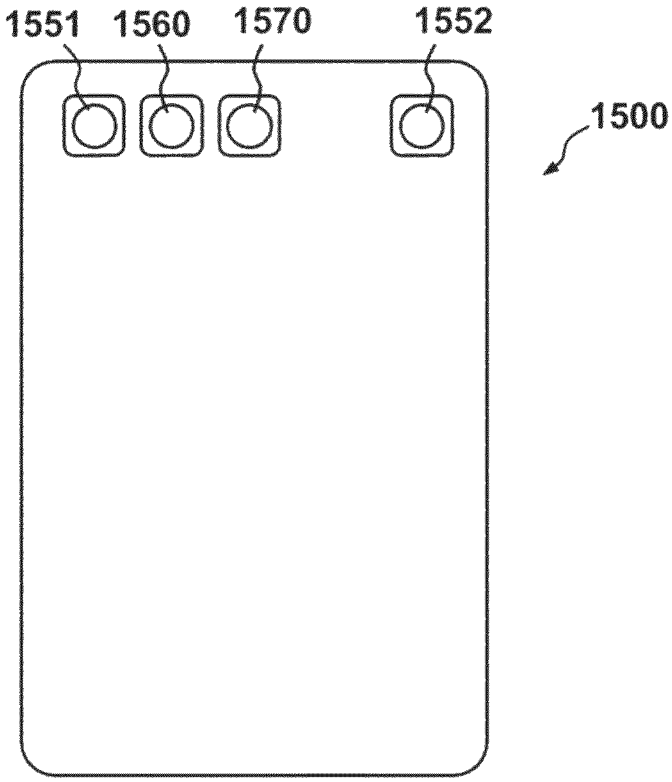

FIGS. 21A and 21B are views showing an example of electronic equipment 1500 on which the photoelectric conversion apparatus is mounted. FIG. 21A shows the front surface side of the electronic equipment 1500, and FIG. 21B shows the back surface side of the electronic equipment 1500.

As shown FIG. 21A, a display 1510 that displays an image is arranged at the center of the front surface of the electronic equipment 1500. Then, front cameras 1521 and 1522 for each of which the above-described photoelectric conversion apparatus 100 is used, an IR light source 1530 that emits infrared rays, and a visible light source 1540 that emits visible light are arranged along the upper side of the front surface of the electronic equipment 1500.

As shown in FIG. 21B, rear cameras 1551 and 1552 for each of which the above-described photoelectric conversion apparatus 100 is used, an IR light source 1560 that emits infrared rays, and a visible light source 1570 that emits visible light are arranged along the upper side of the back surface of the electronic equipment 1500.

By applying the above-described photoelectric conversion apparatus 100, the electronic equipment 1500 having the above arrangement can capture, for example, an image of higher quality. Note that the photoelectric conversion apparatus can be applied to electronic equipment such as an infrared sensor, a distance measurement sensor using an active infrared source, a security camera, or a personal or biometric authentication camera. This can improve the accuracy and performance of the electronic equipment.

Figure 22:
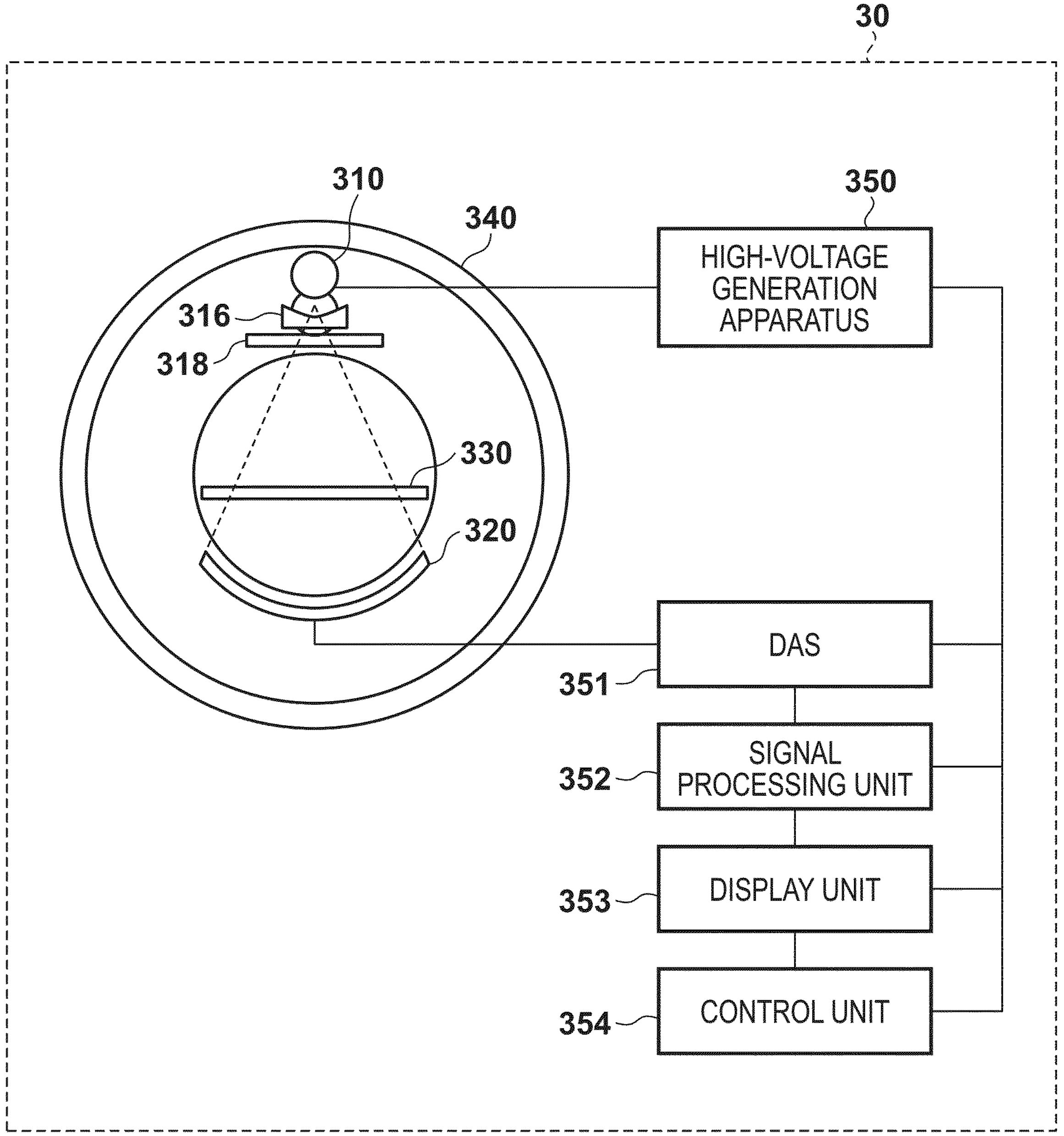
FIG. 22 is a functional block diagram of a photoelectric conversion system according to the eighth embodiment.

The eighth embodiment will be described with reference to FIG. 22. FIG. 22 is a block diagram of an X-ray CT apparatus according to this embodiment. The above-described photoelectric conversion apparatus 100 is applicable to a detector of the X-ray CT apparatus. An X-ray CT apparatus 30 according to this embodiment includes an X-ray generation unit 310, a wedge 316, a collimator 318, an X-ray detection unit 320, a top plate 330, a rotating frame 340, a high-voltage generation apparatus 350, a Data Acquisition System (DAS) 351, a signal processing unit 352, a display unit 353, and a control unit 354.

The X-ray generation unit 310 is formed from, for example, a vacuum tube that generates X-rays. The vacuum tube of the X-ray generation unit 310 is supplied with a filament current and a high voltage from the high-voltage generation apparatus 350. When thermoelectrons are emitted from a cathode (filament) to an anode (target), X-rays are generated.

The wedge 316 is a filter that adjusts the amount of X-rays emitted from the X-ray generation unit 310. The wedge 316 attenuates the amount of X-rays so that the X-rays emitted from the X-ray generation unit 310 to an object has a predetermined distribution. The collimator 318 is formed from a lead plate that narrows the irradiation range of the X-rays having passed through the wedge 316. The X-rays generated by the X-ray generation unit 310 is formed in a cone beam shape via the collimator 318, and the object on the top plate 330 is irradiated with the X-rays.

The X-ray detection unit 320 is formed using the above-described photoelectric conversion apparatus 100. The X-ray detection unit 320 detects the X-rays having passed through the object from the X-ray generation unit 310, and outputs a signal corresponding to the amount of the X-rays to the DAS 351.

The rotating frame 340 is annular, and is configured to be rotatable. The X-ray generation unit 310 (the wedge 316 and the collimator 318) and the X-ray detection unit 320 are arranged to face each other in the rotating frame 340. The X-ray generation unit 310 and the X-ray detection unit 320 can rotate together with the rotating frame 340.

The high-voltage generation apparatus 350 includes a boosting circuit, and outputs a high voltage to the X-ray generation unit 310. The DAS 351 includes an amplification circuit and an A/D conversion circuit, and outputs, as digital data, a signal from the X-ray detection unit 320 to the signal processing unit 352.

The signal processing unit 352 includes a Central Processing Unit (CPU), a Read Only Memory (ROM), and a Random Access Memory (RAM), and can execute image processing and the like for the digital data. The display unit 353 includes a flat display apparatus or the like, and can display an X-ray image. The control unit 354 includes a CPU, a ROM, a RAM, and the like, and controls the operation of the overall X-ray CT apparatus 30.

The above-described embodiments can be changed appropriately without departing from the technical concept. Note that contents disclosed in this specification include not only contents described in this specification but also all items that can be grasped from this specification and its accompanying drawings. The contents disclosed in this specification include a complementary set of concepts described in this specification. That is, if, for example, "A is larger than B" is described in this specification, this specification is considered to disclose "A is not larger than B" even if a description of "A is not larger than B" is omitted. This is because if "A is larger than B" is described, it is assumed that a case in which "A is not larger than B" has been considered.

According to the present disclosure, a technique advantageous in improving the temperature detection accuracy can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-140273, filed Aug. 30, 2023, which is hereby incorporated by reference herein in its entirety.

What is claimed is:

1. A photoelectric conversion apparatus comprising a first substrate including an avalanche photodiode, a second substrate, a third substrate, and a temperature detection element having an output characteristic dependent on temperature, wherein a signal processing circuit configured to process a signal output from the avalanche photodiode is arranged in at least parts of the second substrate and the third substrate, the first substrate, the second substrate, and the third substrate are stacked such that the second substrate is arranged between the first substrate and the third substrate, the temperature detection element is arranged in one of the first substrate and the second substrate, the second substrate comprises a first semiconductor layer, and a first insulating layer arranged between the first semiconductor layer and the third substrate, the third substrate comprises a second semiconductor layer, and a second insulating layer arranged between the second semiconductor layer and the first insulating layer, the second substrate and the third substrate are bonded via a plurality of first bonded portions, in each of the plurality of first bonded portions, a metal pattern arranged in a surface of the first insulating layer facing the third substrate is in contact with a metal pattern arranged in a surface of the second insulating layer facing the second substrate, a bonded face between the second substrate and the third substrate includes a first region where, among the plurality of first bonded portions, not less than one bonded portion in contact with a metal plug is arranged, and a second region where, among the plurality of first bonded portions, not less than one bonded portion in contact with no metal plug is arranged, and in an orthogonal projection to the bonded face, the temperature detection element is arranged at a position overlapping the second region.

2. The apparatus according to claim 1, further comprising a temperature value generation circuit configured to generate a signal indicating temperature information from an output of the temperature detection element, wherein the temperature detection element and the temperature value generation circuit are arranged in the second substrate.

3. The apparatus according to claim 2, wherein the second substrate further comprises a third insulating layer arranged between the first semiconductor layer and the first substrate, the first substrate comprises a third semiconductor layer, and a fourth insulating layer arranged between the third semiconductor layer and the third insulating layer, the first substrate and the second substrate are bonded via a plurality of second bonded portions, in each of the plurality of second bonded portions, a metal pattern arranged in a surface of the third insulating layer facing the first substrate is in contact with a metal pattern arranged in a surface of the fourth insulating layer facing the second substrate, and in the orthogonal projection to the bonded face, among the plurality of second bonded portions, a second bonded portion arranged at a position overlapping the temperature detection element includes a bonded portion in contact with a metal plug.

4. The apparatus according to claim 3, wherein among the plurality of second bonded portions, a bonded portion in contact with a metal plug is electrically connected to a wiring pattern arranged in the fourth insulating layer via a metal plug connected to the bonded portion in contact with the metal plug.

5. The apparatus according to claim 4, wherein the wiring pattern is electrically connected to the avalanche photodiode.

6. The apparatus according to claim 1, further comprising a temperature value generation circuit configured to generate a signal indicating temperature information from an output of the temperature detection element, wherein the temperature detection element is arranged in the second substrate, and the temperature value generation circuit is arranged in a chip different from a chip where the first substrate, the second substrate, and the third substrate are stacked.

7. The apparatus according to claim 1, wherein the temperature detection element is arranged in the first substrate.

8. The apparatus according to claim 7, wherein a wiring pattern electrically connected to the avalanche photodiode is arranged so as to surround at least a part of a wiring pattern electrically connected to the temperature detection element.

9. The apparatus according to claim 7, further comprising a temperature value generation circuit configured to generate a signal indicating temperature information from an output of the temperature detection element, wherein the temperature value generation circuit is arranged in the second substrate.

10. The apparatus according to claim 7, further comprising a temperature value generation circuit configured to generate a signal indicating temperature information from an output of the temperature detection element, wherein the temperature value generation circuit is arranged in a chip different from a chip where the first substrate, the second substrate, and the third substrate are stacked.

11. The apparatus according to claim 10, wherein the second substrate further comprises a third insulating layer arranged between the first semiconductor layer and the first substrate, the first substrate comprises a third semiconductor layer, and a fourth insulating layer arranged between the third semiconductor layer and the third insulating layer, the first substrate and the second substrate are bonded via a plurality of second bonded portions, in each of the plurality of second bonded portions, a metal pattern arranged in a surface of the third insulating layer facing the first substrate is in contact with a metal pattern arranged in a surface of the fourth insulating layer facing the second substrate, a bonded face between the first substrate and the second substrate includes a third region where, among the plurality of second bonded portions, not less than one bonded portion in contact with a metal plug is arranged, and a fourth region adjacent to the third region where, among the plurality of second bonded portions, not less than one bonded portion in contact with no metal plug is arranged, and in an orthogonal projection to the bonded face, the temperature detection element is arranged at a position overlapping the fourth region.

12. The apparatus according to claim 1, wherein a first signal processing circuit arranged in the second substrate among the signal processing circuits comprises a transistor supplied with a power supply voltage higher than a power supply voltage supplied to a second signal processing circuit arranged in the third substrate among the signal processing circuits.

13. The apparatus according to claim 1, wherein the temperature detection element includes a diode.

14. The apparatus according to claim 13, wherein in a planar view, the diode is larger than the avalanche photodiode.

15. Equipment comprising:

the photoelectric conversion apparatus according to claim 1; and a signal processing circuit configured to generate an image using a signal output from the photoelectric conversion apparatus.

16. A moving body that comprises the photoelectric conversion apparatus according to claim 1, comprising a control circuit configured to control movement of the moving body using a signal output by the photoelectric conversion apparatus.

17. Equipment that comprises the photoelectric conversion apparatus according to claim 1, further comprising at least any of:

an optical system corresponding to the photoelectric conversion apparatus, a control circuit configured to control the photoelectric conversion apparatus;

a processing circuit configured to process a signal output from the photoelectric conversion apparatus;

a display circuit configured to display information obtained by the photoelectric conversion apparatus;

a storage circuit configured to store information obtained by the photoelectric conversion apparatus; and a mechanical circuit configured to operate based on information obtained by the photoelectric conversion apparatus.

18. A photoelectric conversion apparatus comprising a first substrate including an avalanche photodiode, a second substrate, a third substrate, and a temperature detection element having an output characteristic dependent on temperature, wherein a signal processing circuit configured to process a signal output from the avalanche photodiode is arranged in at least parts of the second substrate and the third substrate, the first substrate, the second substrate, and the third substrate are stacked such that the second substrate is arranged between the first substrate and the third substrate, the temperature detection element is arranged in one of the first substrate and the second substrate, the second substrate comprises a first semiconductor layer, and a first insulating layer arranged between the first semiconductor layer and the third substrate, the third substrate comprises a second semiconductor layer, and a second insulating layer arranged between the second semiconductor layer and the first insulating layer, the second substrate and the third substrate are bonded via a plurality of first bonded portions, in each of the plurality of first bonded portions, a metal pattern arranged in a surface of the first insulating layer facing the third substrate is in contact with a metal pattern arranged in a surface of the second insulating layer facing the second substrate, and in an orthogonal projection to a bonded face between the second substrate and the third substrate, no metal plug is in contact with, among the plurality of first bonded portions, a bonded portion arranged at a position overlapping the temperature detection element.

19. A photoelectric conversion apparatus comprising a first substrate including an avalanche photodiode, a second substrate including a signal processing circuit configured to process a signal output from the avalanche photodiode, and a temperature detection element having an output characteristic dependent on temperature, wherein the first substrate and the second substrate are stacked, the temperature detection element is arranged in the first substrate, the first substrate comprises a first semiconductor layer, and a first insulating layer arranged between the first semiconductor layer and the second substrate, the second substrate comprises a second semiconductor layer, and a second insulating layer arranged between the second semiconductor layer and the first insulating layer, the first substrate and the second substrate are bonded via a plurality of bonded portions, in each of the plurality of bonded portions, a metal pattern arranged in a surface of the first insulating layer facing the second substrate is in contact with a metal pattern arranged in a surface of the second insulating layer facing the first substrate, a bonded face between the first substrate and the second substrate includes a first region where, among the plurality of bonded portions, not less than one bonded portion in contact with a metal plug is arranged, and a second region where, among the plurality of bonded portions, not less than one bonded portion in contact with no metal plug is arranged, and in an orthogonal projection to the bonded face, the temperature detection element is arranged at a position overlapping the second region.

* * * * *